US012660253B2

(12) United States Patent　　　(10) Patent No.: US 12,660,253 B2

Ito et al.　　　(45) Date of Patent: Jun. 16, 2026

(54) TRANSISTOR AND SEMICONDUCTOR DEVICE

(71) Applicant: SEMICONDUCTOR ENERGY LABORATORY CO., LTD., Atsugi (JP)

(72) Inventors: Yuki Ito, Nagoya (JP); Hitoshi Kunitake, Isehara (JP); Kazuki Tanemura, Isehara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 432 days.

(21) Appl. No.: 18/036,727

(22) PCT Filed: Nov. 9, 2021

(86) PCT No.: PCT/IB2021/060337

§ 371 (c)(1),
(2) Date: May 12, 2023

(87) PCT Pub. No.: WO2022/106955

PCT Pub. Date: May 27, 2022

(65) Prior Publication Data

US 2023/0411521 A1　　　Dec. 21, 2023

(30) Foreign Application Priority Data

Nov. 20, 2020　　(JP) ................................. 2020-193613

(51) Int. Cl.
　H10D 30/69 (2025.01)
　G11C 11/22 (2006.01)
　H10D 30/67 (2025.01)

(52) U.S. Cl.
　CPC ....... H10D 30/701 (2025.01); H10D 30/6734 (2025.01); H10D 30/6739 (2025.01);
　　　(Continued)

(58) Field of Classification Search
　CPC . G11C 11/223; G11C 11/2275; H10D 30/701; H10D 30/6735
　See application file for complete search history.

(56) References Cited

U.S. PATENT DOCUMENTS 8,455,868 B2 　6/2013 　Yamazaki et al.
8,547,771 B2 　10/2013 　Koyama
　　　(Continued)

FOREIGN PATENT DOCUMENTS

CN 　　101997002 A 　3/2011
CN 　　102405521 A 　4/2012
　　　(Continued)

OTHER PUBLICATIONS

WO2010/131311 A1 English Translation (Year: 2025).*
　　　(Continued)

*Primary Examiner* — Vincent Wall
(74) *Attorney, Agent, or Firm* — NIXON PEABODY LLP; Jeffrey L. Costellia

(57) ABSTRACT

A transistor having a large S value or a semiconductor device performing calculation utilizing a transistor operation in a subthreshold region is provided. The transistor includes an oxide semiconductor layer including a channel formation region, a gate electrode including a region overlapping with the oxide semiconductor layer with an insulating layer therebetween, and a first conductive layer including a region overlapping with the oxide semiconductor layer with a ferroelectric layer therebetween. In particular, the ferroelectric layer includes a crystal having a crystal structure exhibiting ferroelectricity.

9 Claims, 14 Drawing Sheets

(52) U.S. Cl.
CPC ........ *H10D 30/6755* (2025.01); *G11C 11/223* (2013.01); *G11C 11/2275* (2013.01)

(56) References Cited

U.S. PATENT DOCUMENTS

| | | | | |
|---|---|---|---|---|
| 8,558,295 | B2 | 10/2013 | Yoon et al. | |
| 8,716,035 | B2 | 5/2014 | Yoon et al. | |
| 8,995,174 | B2 | 3/2015 | Koyama | |
| 9,349,735 | B2 | 5/2016 | Yamazaki et al. | |
| 9,991,265 | B2 | 6/2018 | Yamazaki et al. | |
| 10,553,589 | B2 | 2/2020 | Yamazaki et al. | |
| 10,580,662 | B2 * | 3/2020 | Jintyou | H01L 21/443 |
| 10,611,868 | B2 | 4/2020 | Wakita et al. | |
| 11,177,792 | B2 | 11/2021 | Koyama | |
| 11,289,145 | B2 * | 3/2022 | Ocker | H10D 1/682 |
| 11,456,296 | B2 | 9/2022 | Yamazaki et al. | |
| 11,568,224 | B2 | 1/2023 | Kurokawa et al. | |
| 11,594,770 | B2 | 2/2023 | Kuriki et al. | |
| 11,677,384 | B2 | 6/2023 | Koyama | |
| 11,769,804 | B2 * | 9/2023 | Xu | H10D 30/701 |
| | | | | 365/145 |
| 2009/0290404 | A1 * | 11/2009 | Kaneko | G11C 11/5657 |
| | | | | 257/295 |
| 2011/0049592 | A1 | 3/2011 | Yoon et al. | |
| 2012/0188815 | A1 * | 7/2012 | Koyama | G11C 11/404 |
| | | | | 365/189.011 |
| 2015/0280691 | A1 | 10/2015 | Koyama | |
| 2018/0327530 | A1 | 11/2018 | Wakita et al. | |
| 2019/0244653 | A1 * | 8/2019 | Tsukamoto | H10B 51/10 |
| 2019/0280694 | A1 * | 9/2019 | Obradovic | G11C 11/54 |
| 2020/0125935 | A1 | 4/2020 | Kurokawa et al. | |
| 2021/0083122 | A1 * | 3/2021 | Naylor | H10D 99/00 |
| 2022/0208259 | A1 * | 6/2022 | Gong | H10B 53/30 |
| 2023/0049977 | A1 * | 2/2023 | Kurokawa | H10D 86/60 |
| 2023/0079244 | A1 | 3/2023 | Yamazaki et al. | |
| 2023/0155199 | A1 | 5/2023 | Kuriki et al. | |
| 2023/0298650 | A1 * | 9/2023 | Yamazaki | H10B 53/30 |
| | | | | 365/145 |
| 2023/0386544 | A1 * | 11/2023 | Godo | G11C 11/405 |
| 2023/0397427 | A1 * | 12/2023 | Yamazaki | G11C 11/2275 |
| 2023/0411521 | A1 * | 12/2023 | Ito | H10D 86/423 |

FOREIGN PATENT DOCUMENTS

| | | | |
|---|---|---|---|
| CN | 108292630 | A | 7/2018 |
| CN | 110622348 | A | 12/2019 |
| CN | 110770737 | A | 2/2020 |
| EP | 3382751 | A | 10/2018 |
| JP | 2010-267704 | A | 11/2010 |
| JP | 2011-049537 | A | 3/2011 |
| JP | 2011-151383 | A | 8/2011 |
| JP | 2012-257187 | A | 12/2012 |
| JP | 2019-023853 | A | 2/2019 |
| KR | 2011-0021632 | A | 3/2011 |
| KR | 2018-0088414 | A | 8/2018 |
| KR | 2019-0140996 | A | 12/2019 |
| KR | 2020-0020813 | A | 2/2020 |
| TW | 201725625 | | 7/2017 |
| TW | 201843904 | | 12/2018 |
| WO | WO-2010/131311 | | 11/2010 |
| WO | WO-2017/090559 | | 6/2017 |
| WO | WO-2018/203170 | | 11/2018 |
| WO | WO-2018/234919 | | 12/2018 |

OTHER PUBLICATIONS

International Search Report (Application No. PCT/IB2021/060337) Dated Feb. 8, 2022.

Written Opinion (Application No. PCT/IB2021/060337) Dated Feb. 8, 2022.

Chicca.E et al., "Neuromorphic electronic circuits for building autonomous cognitive systems", arXiv:1403.6428, May 25, 2014, pp. 1-19, Cornell University.

Guo.X et al., "Fast, Energy-Efficient, Robust, and Reproducible Mixed-Signal Neuromorphic Classifier Based on Embedded NOR Flash Memory Technology", IEDM 17: Technical Digest of International Electron Devices Meeting, Dec. 2, 2017, pp. 151-154.

* cited by examiner

FIG. 12A
Intermediate state
New crystalline phase
| Amorphous | Crystalline | Crystal |
|---|---|---|
| ·completely amorphous | ·CAAC<br>·nc<br>·CAC<br><br>excluding single crystal and poly crystal | ·single crystal<br>·poly crystal |
FIG. 12B
FIG. 12C
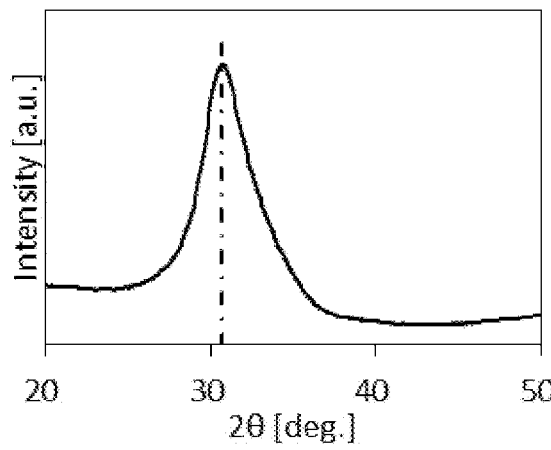
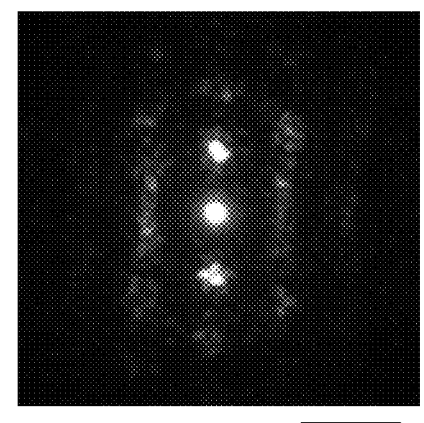
5nm⁻¹

5100

5102

5101

5200

5202

5201

5203

5300

5301

5304

5303

5302

5306

5305

5400

5402

5500

5501

5502

5502

5504

5703 5704 5701

5702

5800

5801

5802

5803

TRANSISTOR AND SEMICONDUCTOR DEVICE

TECHNICAL FIELD

One embodiment of the present invention relates to a transistor, a semiconductor device, and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a storage device, a signal processing device, a processor, an electronic device, a system, a driving method thereof, a manufacturing method thereof, and a testing method thereof.

BACKGROUND ART

In recent years, semiconductor devices have been developed to be mainly used for LSI, CPUs, memories, and the like. A CPU is an aggregation of semiconductor elements; the CPU includes a semiconductor integrated circuit (including at least a transistor and a memory) separated from a semiconductor wafer, and is provided with an electrode that is a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material is widely known as a semiconductor thin film applicable to the transistor and further, an oxide semiconductor has been attracting attention as another material.

It is known that a transistor using an oxide semiconductor has an extremely low leakage current in a non-conduction state. For example, a low-power-consumption CPU utilizing a characteristic of a low leakage current of the transistor using an oxide semiconductor is disclosed (see Patent Document 1). Furthermore, for example, a storage device that can retain stored contents for a long time by utilizing a characteristic of a low leakage current of the transistor using an oxide semiconductor is disclosed (see Patent Document 2).

In recent years, demand for an integrated circuit with higher density has risen with reductions in size and weight of electronic devices. Furthermore, the productivity of a semiconductor device including an integrated circuit is desired to be improved.

Currently, artificial intelligence (AI) has been developed; in particular, integrated circuits that imitate the mechanism of the human brain have been actively developed. The integrated circuits incorporate electronic circuits as the brain mechanism and include circuits corresponding to "neurons" and "synapses" of the human brain. Such integrated circuits may therefore be called "neuromorphic", "brain-morphic", or "brain-inspired" circuits, for example. The integrated circuits have a non-von Neumann architecture and are expected to be able to perform parallel processing with extremely low power consumption as compared with a von Neumann architecture, in which power consumption increases with increasing processing speed.

An information processing model that imitates a biological neural network including "neurons" and "synapses" is called an artificial neural network (ANN). By using an artificial neural network, inference with an accuracy as high as or higher than that of a human can be carried out. In a neural network, the main arithmetic operation is the weighted sum operation of outputs from neurons, i.e., the product-sum operation.

Non-Patent Document 1 proposes a product-sum operation circuit including a nonvolatile memory element. Each memory element of the product-sum operation circuit outputs current corresponding to a product of data corresponding to a multiplier stored in each memory element and input data corresponding to a multiplicand by using operation in a subthreshold region of a transistor containing silicon in its channel formation region. That is, calculation with an analog value is possible. With the sum of currents output from the memory elements in each column, data corresponding to product-sum operation is obtained. The product-sum operation circuit includes memory elements therein, and thus does not need to read and write data from and to an external memory when carrying out multiplication or addition. This can decrease the number of times of data transfer for reading, writing, and the like; thus, the power consumption should be reduced.

REFERENCE

Patent Document

[Patent Document 1] Japanese Published Patent Application No. 2012-257187
[Patent Document 2] Japanese Published Patent Application No. 2011-151383

Non-Patent Document

[Non-Patent Document 1] X. Guo et al., "Fast, Energy-Efficient, Robust, and Reproducible Mixed-Signal Neuromorphic Classifier Based on Embedded NOR Flash Memory Technology" IEDM2017, pp. 151-154.

SUMMARY OF THE INVENTION

Problems to be Solved by the Invention

In the case where analog calculation using a subthreshold region of a transistor is performed, a wide subthreshold region and a large S value are required in order to ensure a voltage range in which a circuit for performing the analog calculation can operate.

In general, transistors have been developed with the aim of having excellent characteristics. Having excellent characteristics here means having high reliability and a sharp change from an off state to an on state, i.e., a small S value. When a semiconductor, an insulating film, or the like with many defects and/or impurities is used in a transistor, a transistor having poor characteristics, i.e., a large S value might be provided; however, such a transistor generally has poor reliability and is not practically used in a circuit. A transistor having high reliability, excellent characteristics, and a large S value is not generally developed.

Since current flows at certain level when a transistor using silicon in an active layer is in an off state, a subthreshold region is not very wide.

It is known that a transistor using an oxide semiconductor has an extremely low leakage current in a non-conduction state. This indicates that the transistor includes a wide subthreshold region. Utilizing this wide subthreshold region for analog calculation is under consideration, and a larger S value is required in order to ensure a margin of a circuit operation.

An object of one embodiment of the present invention is to provide a transistor having high reliability and a large S value. Another object of one embodiment of the present invention is to provide a semiconductor device performing calculation utilizing a transistor operation in a subthreshold region. Another object of one embodiment of the present invention is to provide a semiconductor device having a wide subthreshold region. Another object of one embodiment of the present invention is to provide a novel transistor or a novel semiconductor device.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems

One embodiment of the present invention is a transistor including an oxide semiconductor layer including a channel formation region, a gate electrode including a region overlapping with the oxide semiconductor layer with an insulating layer therebetween, and a first conductive layer including a region overlapping with the oxide semiconductor layer with a ferroelectric layer therebetween. The ferroelectric layer includes a crystal having a crystal structure exhibiting ferroelectricity.

Another embodiment of the present invention is a semiconductor device including a first transistor that includes a first oxide semiconductor layer including a channel formation region, a first insulating layer, a first gate electrode including a region overlapping with the first oxide semiconductor layer with the first gate insulating layer therebetween, and a first conductive layer including a region overlapping with the first oxide semiconductor layer with a ferroelectric layer therebetween, and a second transistor that includes a second oxide semiconductor layer including a channel formation region, a second insulating layer, a second gate electrode including a region overlapping with the second oxide semiconductor layer with the second gate insulating layer therebetween, and the ferroelectric layer. The second transistor does not include a conductive layer in contact with the ferroelectric layer and overlapping with the second oxide semiconductor layer with the ferroelectric layer therebetween. The ferroelectric layer includes a crystal having a crystal structure exhibiting ferroelectricity.

Another embodiment of the present invention includes a first transistor, a second transistor, a third transistor, a fourth transistor, a first capacitor, and a second capacitor. A gate of the first transistor and a gate of the second transistor are electrically connected to a first wiring. One of a source and a drain of the first transistor and one of a source and a drain of the third transistor are electrically connected to a second wiring. The other of the source and the drain of the first transistor is electrically connected to a gate of the third transistor. One of a source and a drain of the second transistor and one of a source and a drain of the fourth transistor are electrically connected to a third wiring. The other of the source and the drain of the second transistor is electrically connected to a gate of the fourth transistor. The gate of the third transistor is connected to the first wiring through the first capacitor. The gate of the fourth transistor is connected to the first wiring through the second capacitor. The third transistor and the fourth transistor each include a first oxide semiconductor layer including a channel formation region, a first gate electrode including a region overlapping with the first oxide semiconductor layer with a first gate insulating layer therebetween, and a conductive layer including a region overlapping with the first oxide semiconductor layer with a ferroelectric layer therebetween. The first transistor and the second transistor each include a second oxide semiconductor layer including a channel formation region, a second gate electrode including a region overlapping with the second oxide semiconductor layer with a second gate insulating layer therebetween, and the ferroelectric layer. The ferroelectric layer includes a crystal having a crystal structure exhibiting ferroelectricity.

In the above embodiments, the ferroelectric layer preferably contains one or both of hafnium and zirconium as a material having ferroelectricity.

In the above embodiments, polarization occurs in the ferroelectric layer by applying an electric field between the first conductive layer and the oxide semiconductor layer.

Another embodiment of the present invention includes a first transistor, a second transistor, a third transistor, a fourth transistor, a first capacitor, and a second capacitor. A gate of the first transistor and a gate of the second transistor are electrically connected to a first wiring. One of a source and a drain of the first transistor and one of a source and a drain of the third transistor are electrically connected to a second wiring. The other of the source and the drain of the first transistor is electrically connected to a gate of the third transistor. One of a source and a drain of the second transistor and one of a source and a drain of the fourth transistor are electrically connected to a third wiring. The other of the source and the drain of the second transistor is electrically connected to a gate of the fourth transistor. The gate of the third transistor is connected to the first wiring through the first capacitor. The gate of the fourth transistor is connected to the first wiring through the second capacitor. An S value of the third transistor and an S value of the fourth transistor are larger than an S value of the first transistor.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, an electronic component including a chip in a package, and the like are examples of the semiconductor device. Moreover, a storage device, a display device, a light-emitting device, a lighting device, an electronic device, and the like themselves are semiconductor devices, or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element having a resistance value higher than 0Ω or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor element" can be sometimes replaced with the terms "resistance", "load", and "region having a resistance value", and the like; conversely, the terms "resistance", "load", and "region having a resistance value" can be sometimes replaced with the term "resistor" and the like. The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1 \times 10^9 \Omega$.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes a circuit element that has a pair of electrodes and a dielectric between the electrodes. The term "capacitor", "parasitic capacitance", "gate capacitance", or the like can be replaced with the term "capacitance" or the like in some cases. Conversely, the term "capacitance" can be replaced with the term "capacitor", "parasitic capacitance", "gate capacitance", or the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can be sometimes replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

Note that an S value is a gate voltage necessary for increasing current (subthreshold current) between a source electrode and a drain electrode by one digit, and in general, the smaller an S value is, the steeper the slope of the subthreshold current with respect to the gate voltage is and the more excellent the switching characteristics are, which are excellent characteristics.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of an off-state current can be reduced, and the withstand voltage of the transistor can be increased (the reliability can be improved). Alternatively, by providing the multi-gate structure, in the case of operation in a saturation region, current flowing between the drain and the source does not change much even if the drain-source voltage changes, and thus the voltage-current characteristics having a flat slope can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, for another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the term "high-level potential" or "low-level potential" does not mean a particular potential. "High-level potential" means a potential positioned on the positive side with respect to "low-level potential", and "low-level potential" means a potential positioned on the negative side with respect to "high-level potential". In the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. Furthermore, the terms do not limit the order of components. For example, a "first" component in one embodiment in this specification and the like can be referred to as a "second" component in other embodiments or the scope of claims. For another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction from which each component is described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", or the like can be interchanged with each other depending on the situation. For example, the term "conductive layer" can be changed into the term "conductive film" in some cases. Moreover, for example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" can also include the case where a plurality of "electrodes" or "wirings" are formed in an integrated manner, for example. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. As another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether current flows or not. Alternatively, a switch has a function of selecting and changing a current path. Thus, a switch may have two or more terminals through which current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conducting state" of the transistor refers to, for example, a state where a source electrode and a drain electrode of the transistor can be regarded as being electrically short-circuited or a state where current can flow between the source electrode and the drain electrode. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

According to one embodiment of the present invention, a transistor having high reliability and a large S value can be provided. According to another embodiment of the present invention, a semiconductor device performing calculation utilizing a transistor operation in a subthreshold region can be provided. According to another embodiment of the present invention, a semiconductor device having a wide sub-threshold region can be provided. According to another embodiment of the present invention, a novel transistor or a novel semiconductor device can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 4 is a diagram illustrating an operating state in Periods T1 and T2.

FIG. 9 is a diagram illustrating an operating state in Periods T8 and T9.

FIG. 12A is a diagram showing classification of crystal structures of IGZO, FIG. 12B is a diagram showing an XRD spectrum of crystalline IGZO, and FIG. 12C is a diagram showing a nanobeam electron diffraction pattern of crystalline IGZO.

MODE FOR CARRYING OUT THE INVENTION

Figure 1A:
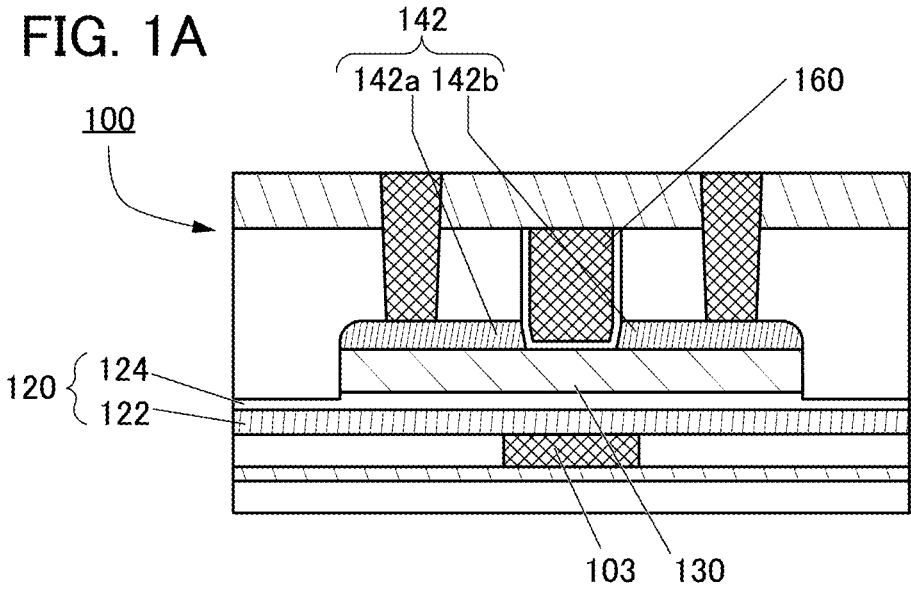
FIG. 1A and FIG. 1B are schematic cross-sectional views each illustrating a structure example of a transistor of a semiconductor device.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, content described in the embodiment is content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be construed as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components may be omitted for clarity of the drawings.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a semiconductor device of one embodiment of the present invention is described.

<Structure Example of Semiconductor Device>

A semiconductor device described in this embodiment is, for example, a transistor having a TGSA (Trench gate self align) structure as illustrated in FIG. 1. The transistor includes a conductive layer 103 also on a back channel side and includes an insulating film between the conductive layer 103 and a semiconductor layer 130. The insulating film includes a ferroelectric layer 120. Here, in the semiconductor layer 130, a side close to a gate electrode 160 is referred to as a front channel side, and a side far from the gate electrode is referred to as a back channel side. As the structure of the transistor, not only the TGSA structure but also what is called a top-gate structure, a bottom-gate structure, or the like may be employed. In these structures, the conductive layer 103 and the ferroelectric layer 120 can be provided on the back channel side. For the ferroelectric layer 120, a material that can have ferroelectricity can be used in a state where ferroelectricity is exhibited.

As the material that can have ferroelectricity, for example, hafnium oxide is preferably used. Alternatively, as the material that can have ferroelectricity, a metal oxide such as zirconium oxide, zirconium hafnium oxide (sometimes referred to as $HfZrO_X$ (X is a real number greater than or the like can be used. Alternatively, as the material that can have ferroelectricity, a material in which an element J1 (the element J1 here is one or more selected from zirconium (Zr), silicon (Si), aluminum (Al), gadolinium (Gd), yttrium (Y), lanthanum (La), strontium (Sr), and the like) is added to hafnium oxide can be used. The atomic ratio of hafnium to the element J1 can be appropriately set here; for example, the atomic ratio of hafnium to the element J1 is 1:1 or the neighborhood thereof. Alternatively, as the material that can have ferroelectricity, a material obtained in which an element J2 (the element J2 here is one or more selected from hafnium (Hf), silicon (Si), aluminum (Al), gadolinium (Gd), yttrium (Y), lanthanum (La), strontium (Sr), and the like) is added to zirconium oxide can be used. The atomic ratio of zirconium to the element J2 can be appropriately set; for example, the atomic ratio of zirconium to the element J2 is 1:1 or the neighborhood thereof. As the material that can have ferroelectricity, a piezoelectric ceramic having a perovskite structure such as lead titanate ($PbTiO_X$), barium strontium titanate (BST), strontium titanate, lead zirconate titanate (PZT), strontium bismuth tantalate (SBT), bismuth ferrite (BFO), or barium titanate may be used.

As the material that can have ferroelectricity, scandium aluminum nitride ($Al_{1-a}Sc_aN_b$ (a is a real number greater than 0 and less than 0.5, and b is 1 or an approximate value thereof, and hereinafter simply referred to as AlScN)), an Al—Ga—Sc nitride, a Ga—Sc nitride, or the like can be used. As the material that can have ferroelectricity, a metal nitride containing an element Ma1, an element Ma2, and nitrogen can be used. Here, the element Ma1 is one or more selected from aluminum (Al), gallium (Ga), indium (In), and the like. The element Ma2 is one or more selected from boron (B), scandium (Sc), yttrium (Y), lanthanoid (lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu)), actinoid (15 elements from actinium (Ac) to lawrencium (Lr)), titanium (Ti), zirconium (Zr), hafnium (Hf), vanadium (V), niobium (Nb), tantalum (Ta), chromium (Cr), and the like. Note that the atomic ratio of the element Ma1 to the element Ma2 can be set as appropriate. A metal oxide containing the element Ma1 and nitrogen has ferroelectricity in some cases even though the metal oxide does not contain the element Ma2. As the material that can have ferroelectricity, a material in which an element Ma3 is added to the above metal nitride can be used. Note that the element Ma3 is one or more selected from magnesium (Mg), calcium (Ca), strontium (Sr), zinc (Zn), cadmium (Cd), and the like. Here, the atomic ratio of the element Ma1 to the element Ma2 and the element Ma3 can be set as appropriate. Since the above metal nitride contains at least a Group 13 element and nitrogen, which is a Group 15 element, the metal nitride is referred to as a ferroelectric of Group III-V, a ferroelectric of a Group III nitride, or the like in some cases.

As the material that can have ferroelectricity, a perovskite-type oxynitride such as $SrTaO_2N$ or $BaTaO_2N$, $GaFeO_3$ with a K-alumina-type structure, or the like can be used.

The material that can have ferroelectricity can be, for example, a mixture or a compound formed of a plurality of materials selected from the above-listed materials. Alternatively, the material that can have ferroelectricity can have a stacked-layer structure of a plurality of materials selected from the above-listed materials. Since the above-listed materials might change their crystal structures and electrical characteristics according to a variety of processes and the like as well as deposition conditions, the above-described material is referred to not only as a ferroelectric but also as a material that can have ferroelectricity in this specification and the like. Furthermore, the ferroelectric also includes a material that can have ferroelectricity. Note that in this specification, a material that can have ferroelectricity is treated as an insulator when the material is not used as a material that can have ferroelectricity explicitly.

A material containing hafnium oxide or a material containing hafnium oxide and zirconium oxide (typically HfZrOx) can have ferroelectricity even when processed into a several-nanometer-thick thin film, and thus is preferable as the material that can have ferroelectricity.

Alternatively, scandium aluminum nitride (AlScN) is preferable as the material that can have ferroelectricity because formation by a sputtering method, in which case the impurity concentration in the film can be reduced or a dense film can be formed. In the case where scandium aluminum nitride (AlScN) is used as the material that can have ferroelectricity, a film having high reliability can be expected.

The thickness of a layer of the material that can have ferroelectricity can be greater than or equal to 1 nm, preferably greater than or equal to 2 nm, further preferably greater than or equal 5 nm. Furthermore, a thickness with which leakage current is not generated is more preferable. The layer of the material that can have ferroelectricity preferably has a thickness that allows an application of a sufficient electric field to occur polarization. For example, the thickness can be less than or equal to 100 nm, preferably less than or equal to 50 nm, further preferably less than or equal to 20 nm, still further preferably less than or equal to 10 nm. That is, the thickness range of the layer of the material that can have ferroelectricity is greater than or equal to 2 nm and less than or equal to 30 nm, preferably greater than or equal to 5 nm and less than or equal to 15 nm. Such a thickness of the material that can have ferroelectricity enables reduction in the thickness and exhibition of ferroelectricity. Note that in this specification and the like, the material that can have ferroelectricity processed into a layered shape is referred to as a ferroelectric layer, a metal oxide film, or a metal nitride film in some cases. Furthermore, a device including such a ferroelectric layer, a metal oxide film, or a metal nitride film is referred to as a ferroelectric device in this specification and the like, in some cases.

In the case where $HfZrO_X$ is used as the material that can have ferroelectricity, an atomic layer deposition (ALD) method, particularly a thermal ALD method, is preferably used for deposition. In the case where the material that can have ferroelectricity is deposited by a thermal ALD method, it is preferable to use a material that does not contain hydrocarbon (also referred to as HC) as a precursor. One or both of hydrogen and carbon contained in the material that can have ferroelectricity may hinder crystallization of the material that can have ferroelectricity. For this reason, it is preferable to lower the concentration of one or both of hydrogen and carbon in the material that can have ferroelectricity by using the precursor that does not contain hydrocarbon, as described above. Examples of the precursor that does not contain hydrocarbon include a chlorine-based material. Note that in the case where a material containing hafnium oxide and zirconium oxide ($HfZrO_x$) is used as the material that can have ferroelectricity, $HfCl_4$ and/or $ZrCl_4$ can be used as the precursor. On the other hand, a dopant (typically silicon, carbon, or the like) for controlling the polarization state may be added to the material that can have ferroelectricity. In that case, a formation method using a material containing hydrocarbon as a precursor may be used as a way of adding carbon as a dopant.

Note that in the case where a film using the material that can have ferroelectricity is deposited, an impurity in the film, which is at least one or more of hydrogen, hydrocarbon, and carbon here, is thoroughly removed, so that a highly purified intrinsic film having ferroelectricity can be formed. Note that manufacturing processes of the highly purified intrinsic film having ferroelectricity and a highly purified intrinsic oxide semiconductor described in the following embodiment are highly compatible with each other. Accordingly, a method for fabricating a semiconductor device with high productivity can be provided.

The material that can have ferroelectricity preferably has a low impurity concentration. In particular, the concentration of hydrogen (H) and carbon (C) is preferably as low as possible. Specifically, the hydrogen concentration of the material that can have ferroelectricity is preferably lower than or equal to $5\times10^{20}$ atoms/cm$^3$, further preferably lower than or equal to $1\times10^{20}$ atoms/cm$^3$. The carbon concentration of the material that can have ferroelectricity is preferably lower than or equal to $5\times10^{19}$ atoms/cm$^3$, further preferably lower than or equal to $1\times10^{19}$ atoms/cm$^3$.

In the case where $HfZrO_X$ is used as the material that can have ferroelectricity, it is preferable to deposit hafnium oxide and zirconium oxide alternately by a thermal ALD method such that the ratio of hafnium oxide to zirconium oxide is 1:1.

In the case where the material that can have ferroelectricity is deposited by a thermal ALD method, $H_2O$ or $O_3$ can be used as an oxidizer. Note that the oxidizer used in the thermal ALD method is not limited thereto. For example, as the oxidizer used in the thermal ALD method, any one or more selected from $O_2$, $O_3$, $N_2O$, $NO_2$, $H_2O$, and $H_2O_2$ may be contained.

The crystal structure of the material that can have ferroelectricity is not particularly limited as long as the material that can have ferroelectricity is in a state where ferroelectricity is exhibited. For example, the crystal structure of the material that can have ferroelectricity may be one or more selected from a cubic crystal system, a tetragonal crystal system, an orthorhombic crystal system, and a monoclinic crystal system. It is particularly preferable that the material that can have ferroelectricity have an orthorhombic crystal structure, in which case ferroelectricity is exhibited. Note that a layer that increases the crystallinity may be formed before forming the material that can have ferroelectricity. For example, in the case where HfZrOx is used as the material that can have ferroelectricity, a metal oxide such as hafnium oxide or zirconium oxide, hafnium, or zirconium can be used for the layer that increases the crystallinity. In the case where AlScN is used as the material that can have ferroelectricity, a metal nitride such as aluminum nitride or scandium nitride, aluminum, or scandium is preferably used for the layer that increases the crystallinity. Alternatively, the material that can have ferroelectricity may have a composite structure of an amorphous structure and a crystal structure. For example, in the case where $HfZrO_X$ is used as the material that can have ferroelectricity, ferroelectricity is exhibited when a crystal structure has an O-phase.

The ferroelectric layer 120 may be a stack of a layer 122 of a material that can have ferroelectricity and an insulator. For example, as illustrated in FIG. 1, the ferroelectric layer 120 may have a structure in which the layer 122 of a material that can have ferroelectricity and an insulating layer 124 that is a first insulating layer are sequentially provided between the conductive layer 103 and the semiconductor layer 130. For example, the ferroelectric layer 120 may have a structure in which a second insulating layer and the layer 122 of a material that can have ferroelectricity are sequentially provided between the conductive layer 103 and the semiconductor layer 130. Moreover, the ferroelectric layer 120 may have a structure in which the second insulating layer, the layer 122 of a material that can have ferroelectricity, and the first insulating layer (the insulating layer 124) are sequentially provided between the conductive layer 103 and the semiconductor layer 130.

As an insulating material used for each of the first insulating layer (the insulating layer 124) and the second insulating layer, a paraelectric material is used; for example, silicon oxide, silicon nitride, silicon oxynitride, silicon nitride, aluminum oxide, aluminum nitride, or aluminum oxynitride can be used. The insulator can be formed by a sputtering method, a CVD method, an MBE method, a PLD method, an ALD method, or the like. A sputtering method is especially preferred when an oxide semiconductor is used for the semiconductor layer 130 since the amount of hydrogen entering a deposited film as an impurity is small.

Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because deposition at a lower temperature is possible.

Figure 1B:
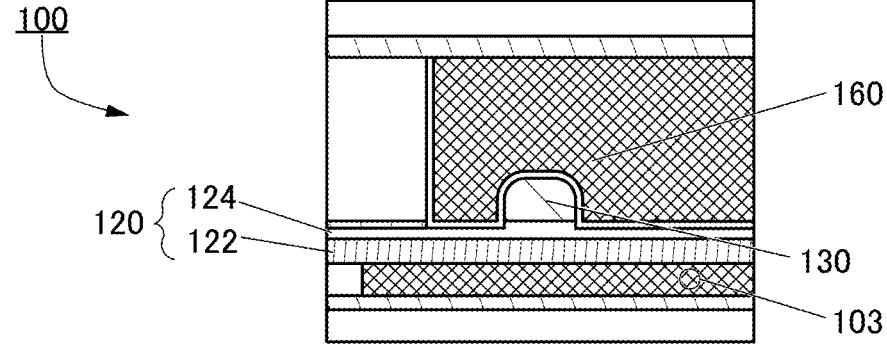

FIG. 1A and FIG. 1B are cross-sectional views each illustrating a structure example of a transistor 100. Note that FIG. 1 illustrates an example in which the layer 122 of a material that can have ferroelectricity and the insulating layer 124 are sequentially provided above the conductive layer 103. Specifically, FIG. 1A is a cross-sectional view of the transistor 100 in the channel direction, and FIG. 1B is a cross-sectional view of the transistor 100 in the channel width direction. The transistor 100 is a transistor (OS transistor) containing a metal oxide (oxide semiconductor) in the semiconductor layer 130. The transistor 100 has a characteristic of an extremely low off-state current. The transistor 100 has a wide subthreshold region in gate and source voltage-drain current characteristics.

As illustrated in FIG. 1A, the transistor 100 includes the conductive layer 103 placed to be embedded in an insulator, the ferroelectric layer 120 placed over the conductive layer 103, the semiconductor layer 130 placed over the ferroelectric layer 120, a conductive layer 142*a* and a conductive layer 142*b* placed apart from each other and in contact with the semiconductor layer 130, and the gate electrode 160.

The conductive layer 103 is placed to be embedded in the insulator and can be formed by what is called a damascene process. With such a structure, the ferroelectric layer 120 can be provided on a relatively flat surface. When the ferroelectric layer 120 is formed on a relatively flat surface, stress applied to the material that can have ferroelectricity can be constant, so that the ferroelectric layer 120 can constantly have the crystal structure of the material that can have ferroelectricity as a crystal structure in which ferroelectricity is exhibited.

As in FIG. 1A, in the cross-sectional view in the channel length direction, the conductive layer 103 is preferably formed longer than the gate electrode 160. This is because such a structure tends to affect the transistor 100 by spontaneous polarization exhibited in the ferroelectric layer 120.

The material that can have ferroelectricity is an insulator and has a property in which application of an electric field from the outside causes internal polarization and the polarization remains even after the electric field is made zero (in this specification, a polarization in the same direction as the direction of the electric field applied from the outside remains). An electric field that remains polarization is applied to the ferroelectric layer 120 provided on the back channel side after the fabrication of the transistor, a characteristic (S value) of the transistor can be changed owing to the influence of the remanent polarization of the ferroelectric layer 120. In the case of an n-channel OS transistor, the S value can be greater than the characteristic of the transistor right after the fabrication of the transistor when the direction of the remanent polarization is the direction from the conductive layer 103 to the semiconductor layer (OS) 130. This is because negative charge is induced on the back channel side in the semiconductor layer (OS) owing to the remanent polarization in the ferroelectric layer 120, and controllability of an electric field by the gate electrode deteriorates.

For example, in the transistor in FIG. 1, 0 V is applied to the gate electrode 160, the conductive layer 142*a*, and the conductive layer 142*b*, and a positive potential is applied to the conductive layer 103. At this time, positive charge is induced in the conductive layer 103, and negative charge is induced in the semiconductor layer (OS) 130. Next, when the potential of the conductive layer 103 is reset from the positive potential to 0 V, some dipoles in the ferroelectric layer have disordered orientation and the polarization decreases, but the other dipoles keep the same orientation (remanent polarization) and the negative charge is kept induced in the semiconductor layer (OS).

According to one embodiment of the present invention, a novel transistor can be provided. According to another embodiment of the present invention, a transistor having high reliability and a large S value can be provided. According to another embodiment of the present invention, a transistor whose S value can be changed after the formation of a semiconductor device can be provided.

According to one embodiment of the present invention, a transistor can be formed differently according to presence or absence of a conductive layer and presence or absence of a ferroelectric layer which are on the back channel side of the transistor, whereby a semiconductor device that includes a transistor whose S value can be changed after the formation of the semiconductor device and a transistor having excellent characteristics in one circuit can be provided.

Note that this embodiment can be combined with any of the other embodiments described in this specification as appropriate.

Embodiment 2

In this embodiment, a product-sum operation circuit including the transistor described in the above embodiment is described.

<Configuration Example of Product-Sum Operation Circuit>

Figure 2:
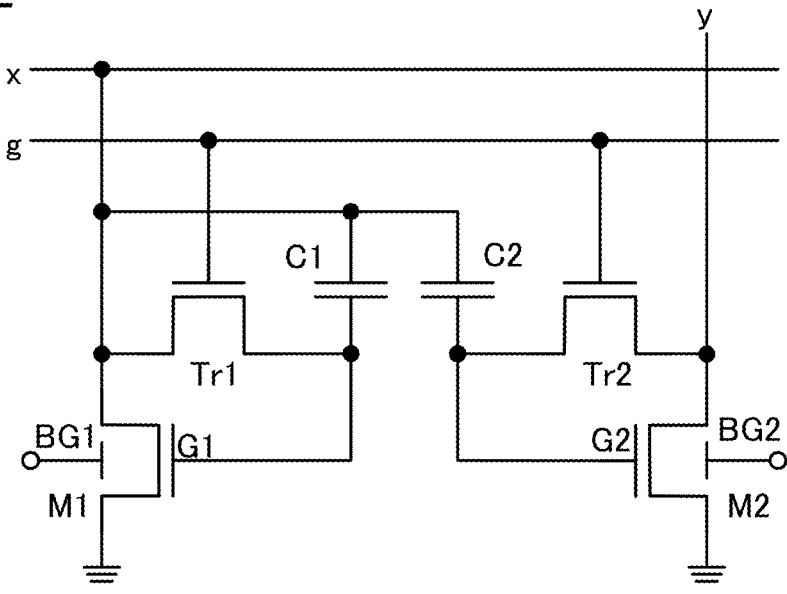
FIG. 2 is a circuit diagram illustrating a configuration example of a product-sum operation circuit of a semiconductor device.

FIG. 2 is an example of a circuit (product-sum operation circuit) that can be used for product-sum operation. The circuit is regarded as one cell and cells may be arranged in a matrix such that m cells (m is an integer greater than or equal to 2) are arranged in the row direction and n cells (n is an integer greater than or equal to 2) are arranged in the column direction so as to form a product-sum operation circuit. Hereinafter, description is made with an arithmetic circuit having one cell as illustrated in FIG. 2 for simplicity. The circuit includes a transistor Tr1, a transistor Tr2, a transistor M1, a transistor M2, a capacitor C1, and a capacitor C2. Here, as the transistor M1 and the transistor M2, the transistor described in Embodiment 1 whose S value can be increased after the fabrication of the transistor can be used. With a large S value of each of the transistor M1 and the transistor M2, the range of voltage to operate the product-sum operation circuit can be widened. When an OS transistor having a small S value with low off-state current is used for each of the transistor Tr and the transistor Tr2, a product-sum operation circuit capable of performing high-speed operation with low power consumption can be provided. The transistor Tr and the transistor Tr2 may have a single gate structure or a dual gate structure. With either structure, the transistor Tr and the transistor Tr2 can be fabricated through a process at the same time as the transistor M1 and the transistor M2.

A driver circuit for driving the circuit in FIG. 2 may be formed in a Si substrate. Stacking the driver circuit with the cell can reduce the area occupied by a circuit. The driver circuit may include an OS transistor. Since an OS transistor has low leakage current, standby current is small, whereby the driver circuit can be a circuit with low power consumption. When the driver circuit includes an OS transistor, the transistor M1 and the transistor M2 can be fabricated through a process at the same time as the transistor Tr and the transistor Tr2, leading to reduction in cost without an increase in the number of steps.

Operation Example 1

Next, an operation example of the arithmetic circuit in FIG. 2 is described.

The transistor M1 and the transistor M2 are transistors each including a ferroelectric layer and a conductive layer on the back channel side. Here, the transistor M1 and the transistor M2 include a gate G1 and a gate G2, respectively. The conductive layers on the back channel side of the transistor M1 and the transistor M2 are referred to as a conductive layer BG1 and a conductive layer BG2.

<Writing to Ferroelectric Layer>

First, the case where the threshold voltage Vth of each of the transistor Tr1, the transistor Tr2, the transistor M1, and the transistor M2 is positive after the fabrication of the transistor Tr1, the transistor Tr2, the transistor M1, and the transistor M2 is described. The transistor Tr1, the transistor Tr2, the transistor M1, and the transistor M2 are assumed to have the same threshold voltage Vth. The S value of each of the transistor Tr1, the transistor Tr2, the transistor M1, and the transistor M2 is assumed to be S1 at the initial value.

Figure 3:
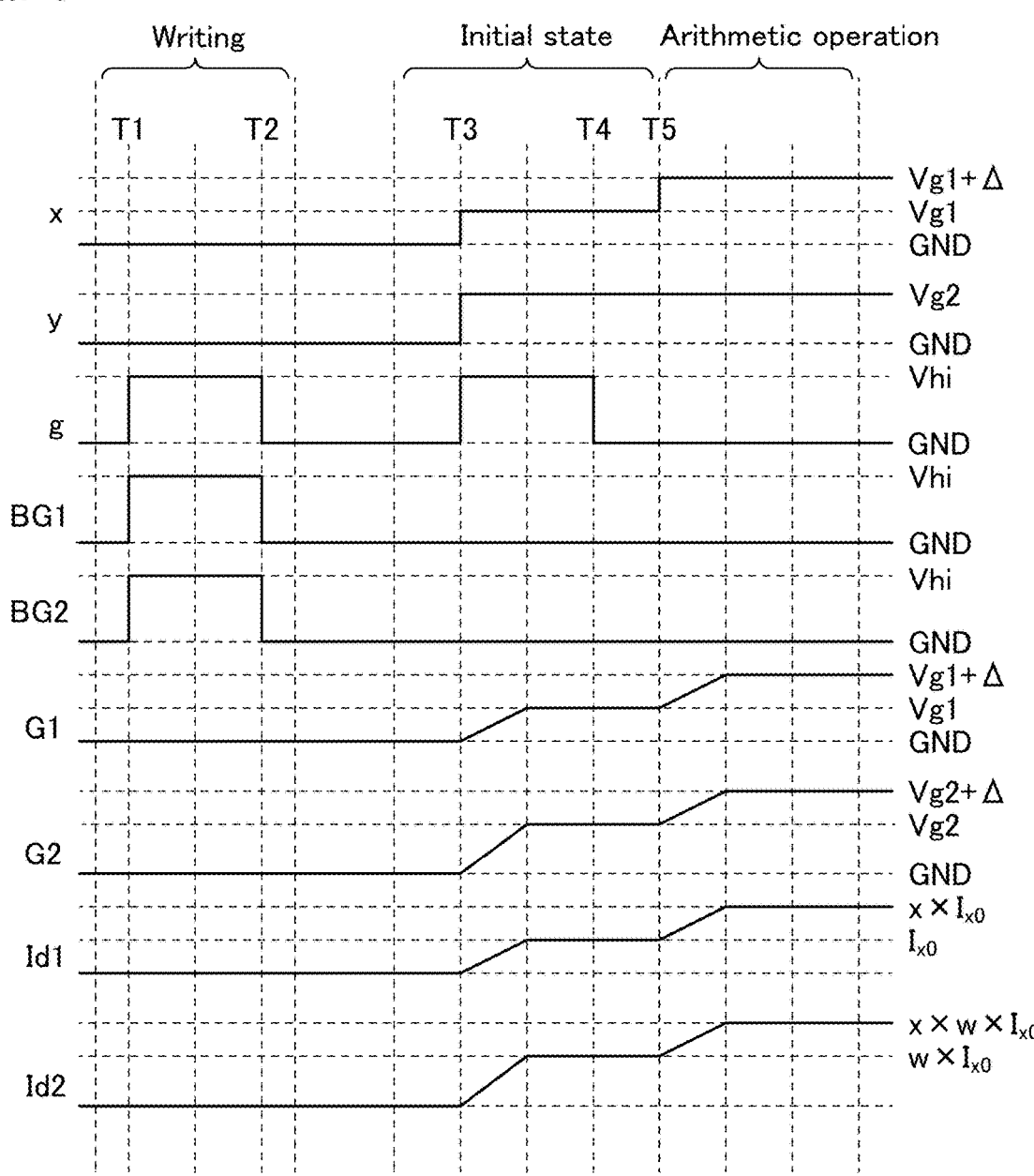
FIG. 3 is a timing chart showing an operation example of a semiconductor device.
Figure 4:
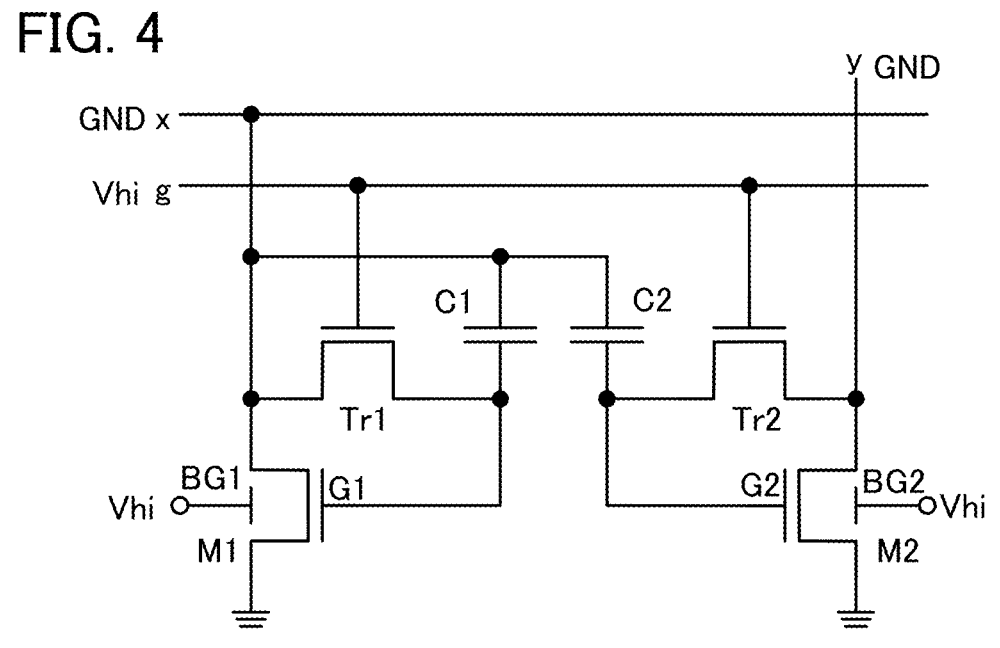
Figure 5:
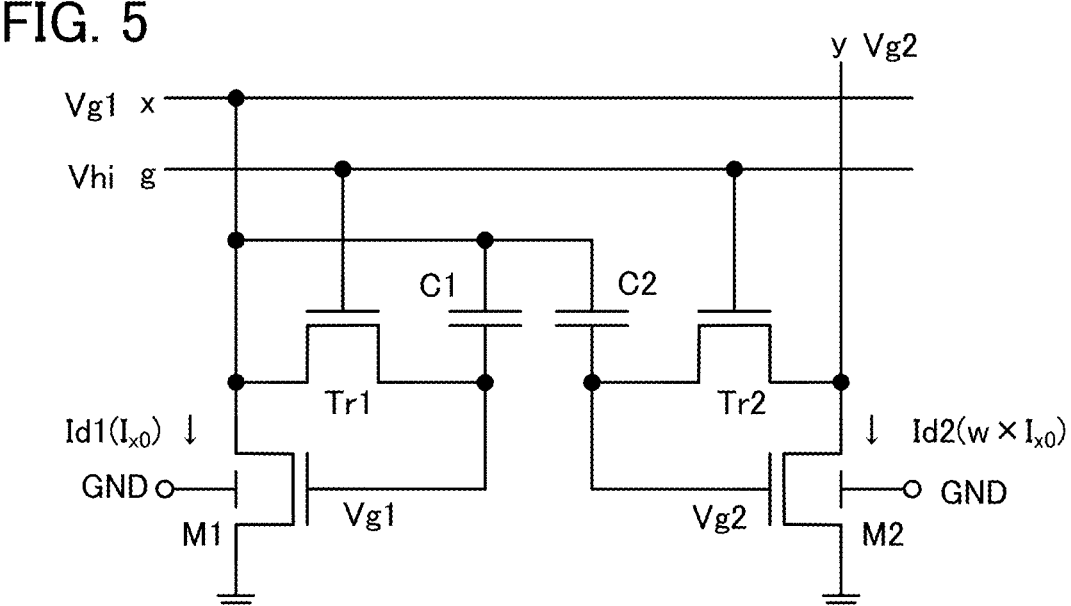
FIG. 5 is a diagram illustrating an operating state in Periods T3 and T4.
Figure 6:
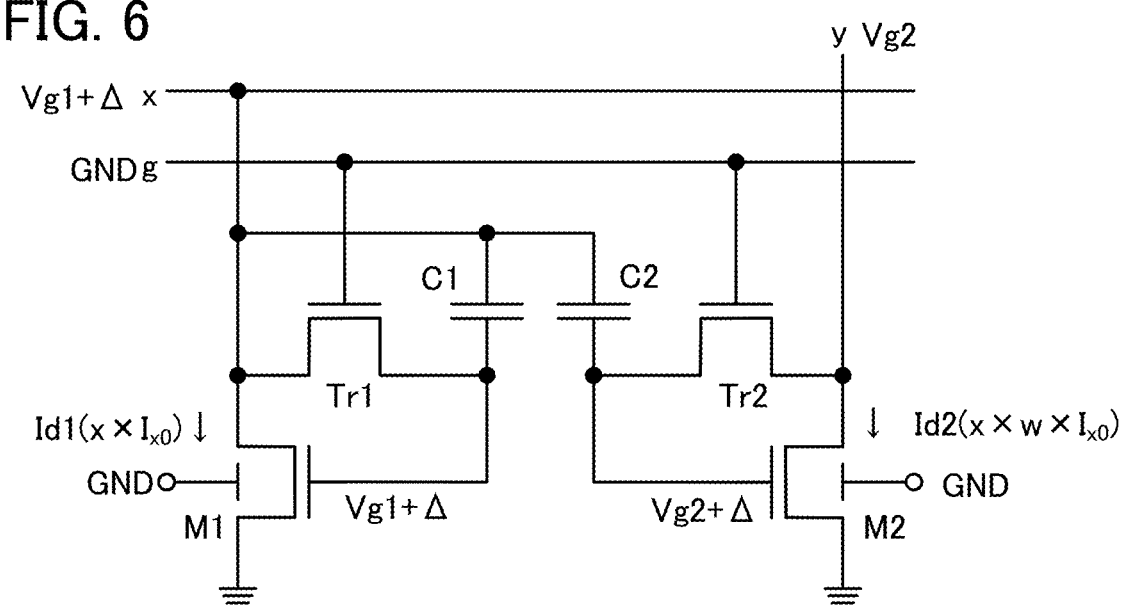
FIG. 6 is a diagram illustrating an operating state after Period T5.

FIG. 3 is a timing chart (T1 to T5) showing an operation example of the arithmetic circuit in FIG. 2. FIG. 4 to FIG. 6 illustrate a state at each timing.

In a non-writing state (before T1), the potentials of all the wirings including the gate G1 and the gate G2 and the terminals are set to a ground potential GND. No spontaneous polarization occurs in the ferroelectric layers of the transistor M1 and the transistor M2.

To increase the S value of each of the transistor M1 and the transistor M2, a positive electric field is applied to a semiconductor layer from the conductive layer BG1 and the conductive layer BG2 on the back channel side such that the positive electric field is greater than or equal to a coercive electric field. For example, for writing (FIG. 3: T1 and T2, and FIG. 4), a high level potential Vhi ($>$Vth$>$0 V) is applied to the conductive layer BG1, the conductive layer BG2, and a wiring g, and the ground potential GND (lower than or equal to 0 V) is applied to a wiring x and a wiring y. By applying such a potential, polarization occurs in the ferroelectric layers of the transistor M1 and the transistor M2, and the polarization (remanent polarization) remains even when the potentials of the conductive layer BG1 and the conductive layer BG2 are reset to the ground potential (T2). Here, the S value of each of the transistor M1 and the transistor M2 changes to S2 ($>$S1) owning to the influence of the remanent polarization. The ground potential may be applied as the potentials of the conductive layer BG1 and the conductive layer BG2 except the time for writing to the ferroelectric layer.

The same potential can be applied to the conductive layer BG1 and the conductive layer BG2 since they are electrically connected to each other. Such a configuration can reduce the number of wirings in the circuit and the area occupied by the circuit. The conductive layer BG1 and the conductive layer BG2 may individually control potentials. By controlling the potentials individually, an optimum potential application corresponding to each of the transistors is possible, and the change of the S value can be precisely controlled.

<Initial State>

Next, arithmetic processing in the transistor M1 and the transistor M2 after writing to the ferroelectric layers is described. Note that current flowing through the wiring x and current flowing through the wiring y are Id1 and Id2, respectively. In an initial state (FIG. 3: T3 and T4, and FIG. 5), the high level potential Vhi is applied to the wiring g, and current with a reference current value $I_{x0}$ flows to the wiring x on the input side, and current with a current value $w \times I_{x0}$ that is w times larger than the reference current value flows to the wiring y on the output side. The reference current value $I_{x0}$ and the current value $w \times I_{x0}$ are set as the amounts of current flowing when the transistor M1 and the transistor M2 operate in a subthreshold region. Since the wiring g has the high level potential Vhi, the transistor Tr and the transistor Tr2 are turned on, and the gate G1 and the gate G2 of the transistor M1 and the transistor M2 have potentials corresponding to the reference current value $I_{x0}$ and the current value $w \times I_{x0}$ over time; the potentials are equal to the potentials applied to the wiring x and the wiring y. Here, these potentials are denoted by Vg1 and Vg2.

After a predetermined time (T4), the potential of the wiring g is reset to the ground potential. Thus, the transistor Tr and the transistor Tr2 are turned off, and the potentials Vg1 and Vg2 of the gate G1 and the gate G2 of the transistor M1 and the transistor M2 are retained.

<Arithmetic Operation>

Next (FIG. 3: from T5, and FIG. 6), the potential of the wiring g remains the ground potential, and current with a current value $x \times I_{x0}$ that is x times larger than the reference current value flows to the wiring x on the input side. Since the potential of the wiring g is the ground potential, the transistor Tr is in an off state and no current flows to the transistor Tr1, but the potential of the gate G1 of the transistor M1 changes to a potential corresponding to the current value $x \times I_{x0}$ due to capacitive coupling of the capacitor C1. The amount of change in the potential is Δ. At this time, when a capacitive coupling coefficient in the periphery of the capacitor C1 is 1, the potentials of the wiring x and the gate G1 of the transistor M1 become Vg1+Δ.

Similarly, when a capacitive coupling coefficient in the periphery of the capacitor C2 is 1, the potential of the gate G2 of the transistor M2 also changes by A due to capacitive coupling between the wiring x and the capacitor C2 and becomes Vg2+Δ. As a result, current with $x \times w \times I_{x0}$ flows to the wiring y on the output side. This is $x \times w$ times larger than the reference current value, and a multiplication result of x and w is output. The current value $x \times I_{x0}$ and the current value $x \times w \times I_{x0}$ are also set as the amounts of current flowing when the transistor M1 and the transistor M2 operate in the subthreshold region.

Here, the current with the current value $x \times w \times I_{x0}$ flowing to the wiring y on the output side is detected by a current detector provided on the GND side of the transistor M2. Moreover, the circuit is regarded as one cell and cells are arranged in a matrix, and current is detected with the use of the wiring y in common in the column direction, whereby product-sum operation can be performed.

Note that in the case where the threshold voltage Vth is positive, positive potentials are applied to the wiring x and the wiring y, and when the conductive layer BG1 of the transistor M1 and the conductive layer BG2 of the transistor M2 are set to GND, an electric field in a direction opposite to that in writing is applied to each of the ferroelectric layers of the transistors M1 and M2. The potentials applied to the wiring x and the wiring y are potentials at which the transistor M1 and the transistor M2 operate in the subthreshold region, and the electric field is small. By driving at high speed, the arithmetic operation can be terminated before the polarization (remanent polarization) written into the ferroelectric layers is reversed or reduced.

Operation Example 2

Next, the case where the threshold voltage Vth of each of the transistor Tr1, the transistor Tr2, the transistor M1, and the transistor M2 is negative after the fabrication of the transistor Tr1, the transistor Tr2, the transistor M1, and the transistor M2 is described.

Figure 7:
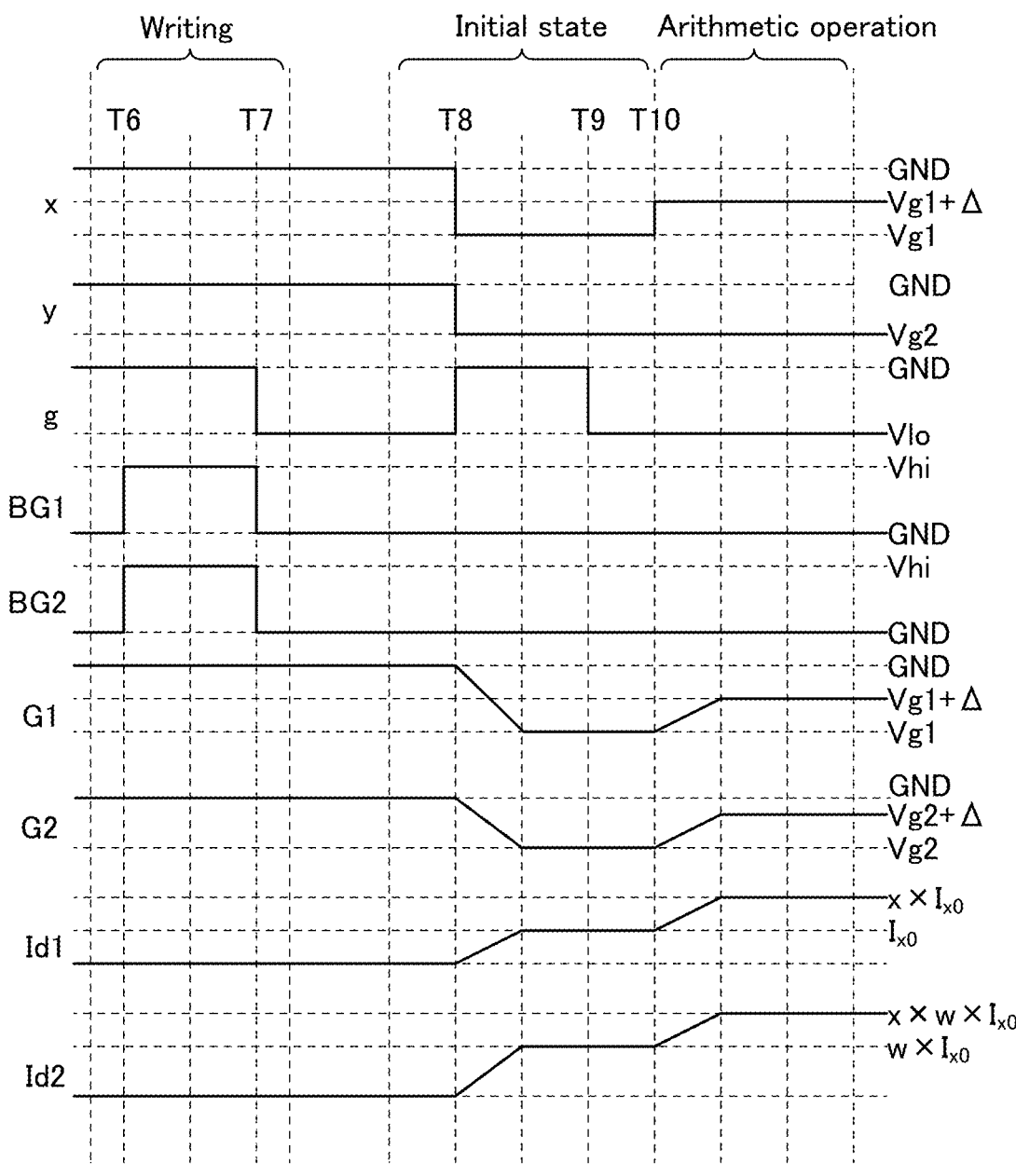
FIG. 7 is a timing chart showing an operation example of a semiconductor device.
Figure 8:
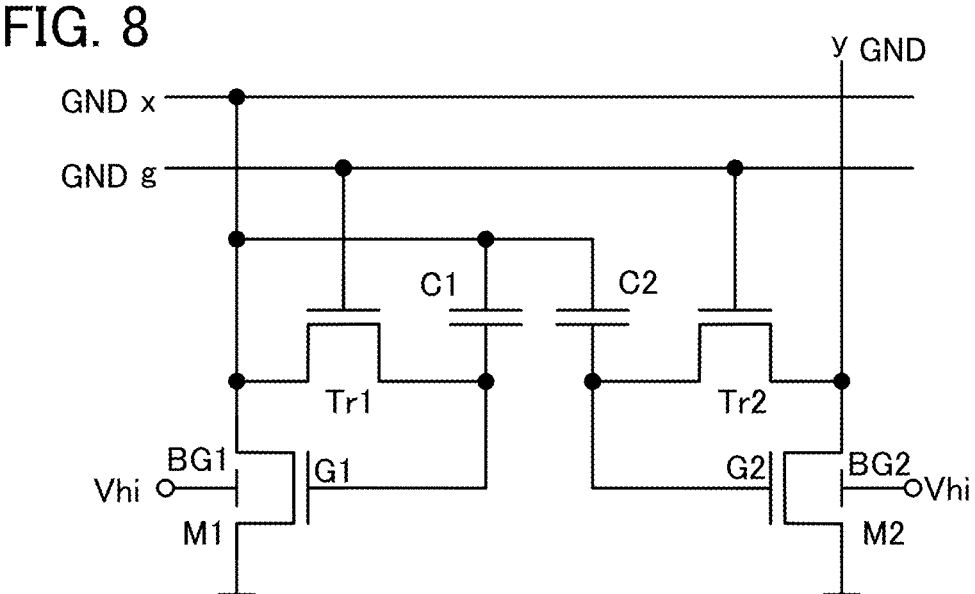
FIG. 8 is a diagram illustrating an operating state in Periods T6 and T7.
Figure 9:
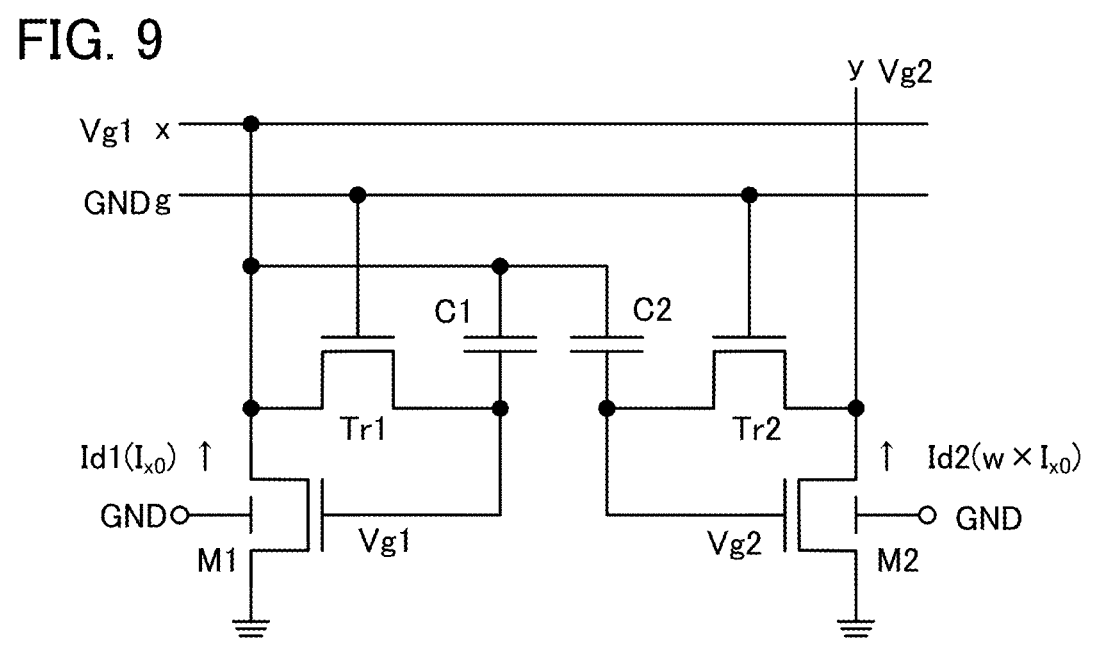
Figure 10:
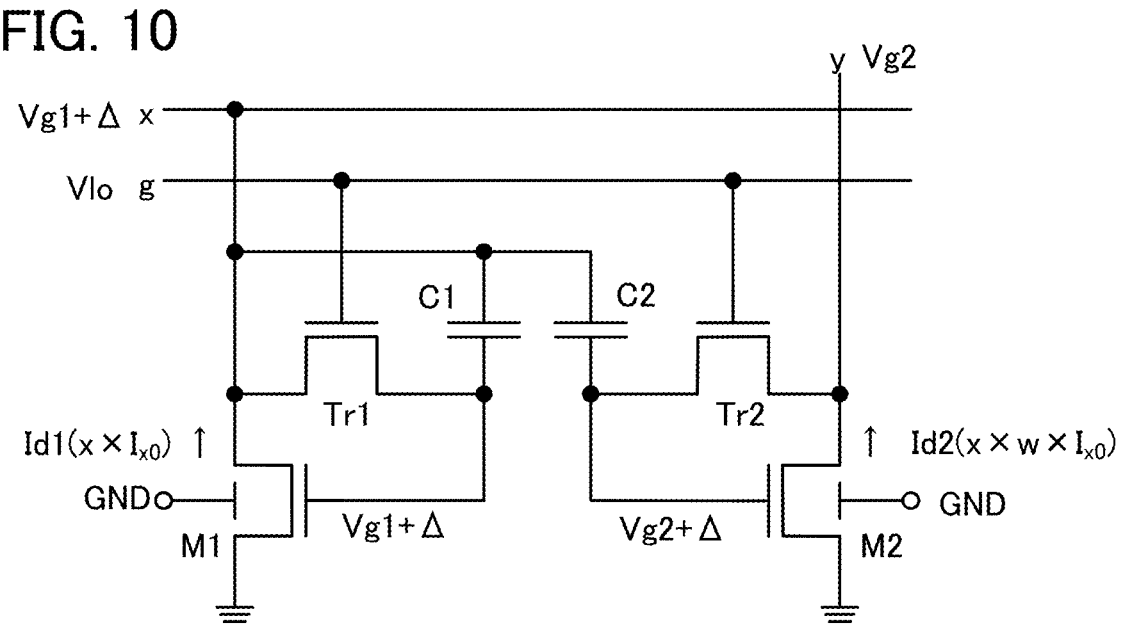
FIG. 10 is a diagram illustrating an operating state after Period T10.

FIG. 7 is a timing chart showing an operation example in the case where the threshold voltage Vth is negative. FIG. 8 to FIG. 10 illustrate a state at each timing.

Even in the case where the threshold voltage Vth is negative, the direction of an electric field applied to each of the ferroelectric layers of the transistors M1 and M2 is the same as that in the case where the threshold voltage Vth is positive. That is, for writing (FIG. 7: T6 and T7, and FIG. 8), the high level potential Vhi (Vhi is a potential greater than 0 V) is applied to the conductive layer BG1 and the conductive layer BG2, and the ground potential GND is applied to the wiring g, the wiring x, and the wiring y. A difference from the case where the threshold voltage Vth is positive is that the high level potential Vhi is not necessarily applied to the wiring g because the gates of the transistors M1 and M2 are on even when the ground potential GND is applied to the wiring g. At the timing (T7) when the potentials of the conductive layer BG1 and the conductive layer BG2 are reset to the ground potential, the potential of the wiring g is a low level potential Vlo. Note that the Vlo is lower than the ground potential GND.

<Initial State>

In an initial state (FIG. 7: T8 and T9, and FIG. 9), the ground potential GND (note that the ground potential GND is higher than Vth) is applied to the wiring g, and the current with the reference current value $I_{x0}$ flows to the wiring x on the input side, and the current with the current value $w \times I_{x0}$ that is w times larger than the reference current value flows to the wiring y on the output side. The reference current value $I_{x0}$ and the current value $w \times I_{x0}$ are set as the amounts of current flowing when the transistors M1 and M2 operate in the subthreshold region; however, since Vth is negative, a low level potential that is lower than the ground potential GND is applied to the wiring x on the input side and the wiring y on the output side.

After a predetermined time (T9), the potential of the wiring g is reset to the low level potential Vlo. Thus, the transistor Tr and the transistor Tr2 are turned off, and the potentials Vg1 and Vg2 of the gate G1 and the gate G2 of the transistor M1 and the transistor M2 are retained.

<Arithmetic Operation>

Next (FIG. 7: from T10, and FIG. 10), the potential of the wiring g remains the low level potential Vlo, and the current with the current value $x \times I_{x0}$ that is x times larger than the reference current value flows to the wiring x on the input side. Since the potential of the wiring g has the low level potential Vlo, the transistor Tr is in an off state and no current flows to the transistor Tr1, but the potential of the gate G1 of the transistor M1 changes to a potential corresponding to the current value $x \times I_{x0}$ due to capacitive coupling of the capacitor C1. At this time, when a capacitive coupling coefficient in the periphery of the capacitor C1 is 1, the potentials of the wiring x and the gate G1 of the transistor M1 become $Vg1 + \Delta$.

Similarly, when a capacitive coupling coefficient in the periphery of the capacitor C2 is 1, the potential of the gate G2 of the transistor M2 also changes by A due to capacitive coupling between the wiring x and the capacitor C2 and becomes $Vg2 + \Delta$. As a result, current with $x \times w \times I_{x0}$ flows to the wiring y on the output side. This is $x \times w$ times larger than the reference current value, and a multiplication result of x and w is output. The current value $x \times I_{x0}$ and the current with $x \times w \times I_{x0}$ are also set as the amount of current flowing when the transistor M1 and the transistor M2 operate in the subthreshold region.

At this time, the arithmetic operation is not performed correctly if the potential applied to the wiring y on the output side changes, whereby the potential of the wiring on the output side needs to be fixed when the threshold voltage Vth is negative.

Writing to the ferroelectric layer may be performed once after the fabrication of the transistor. Since polarization remains when no electric field in a direction opposite to that in wiring is applied, writing operation does not need to be performed every time product-sum operation is performed. Once writing is performed to the ferroelectric layers, the increased S value of each of the transistor M1 and the transistor M2 is retained owing to an influence of the remanent polarization, whereby the conductive layer BG1 and the conductive layer BG2 can have the ground potential GND or the like in the arithmetic processing. Since the application and control of the potentials to the conductive layer BG1 and the conductive layer BG2 are not necessarily performed, the arithmetic processing can be performed with low power consumption. That is, the processing between T2 and T3 and between T7 and T8 may be performed successively; however, the successive processing is not necessarily performed.

The characteristics (Id-Vg characteristics when the S value is S2) in the subthreshold region of each of the transistor M1 and the transistor M2 are preferably examined in advance. The transistor M1 and the transistor M2 each have characteristics in that the S value is increased, so that potential to be applied to the wiring x and the wiring y with respect to current desired to be supplied can be minutely (accurately) adjusted, and thus product-sum operation with a wider range of voltage for driving a semiconductor device in the wiring x and the wiring y is possible. Even when the characteristics in the subthreshold region of each of the transistor M1 and the transistor M2 are not clear, the arithmetic operation can be correctly performed when values of current flowing to the wiring x and the wiring y are detected and the increase in the potential of each wiring can be stopped.

One embodiment of the present invention can provide a transistor having high reliability and a large S value. A semiconductor device that uses a subthreshold region for calculation can be provided. One embodiment of the present invention can provide a semiconductor device capable of performing product-sum operation with a wider range of voltage for driving the semiconductor device.

Embodiment 3

This embodiment describes structure examples of the semiconductor device described in the above embodiment and structure examples of a transistor that can be used in the semiconductor device.

Figure 11A:
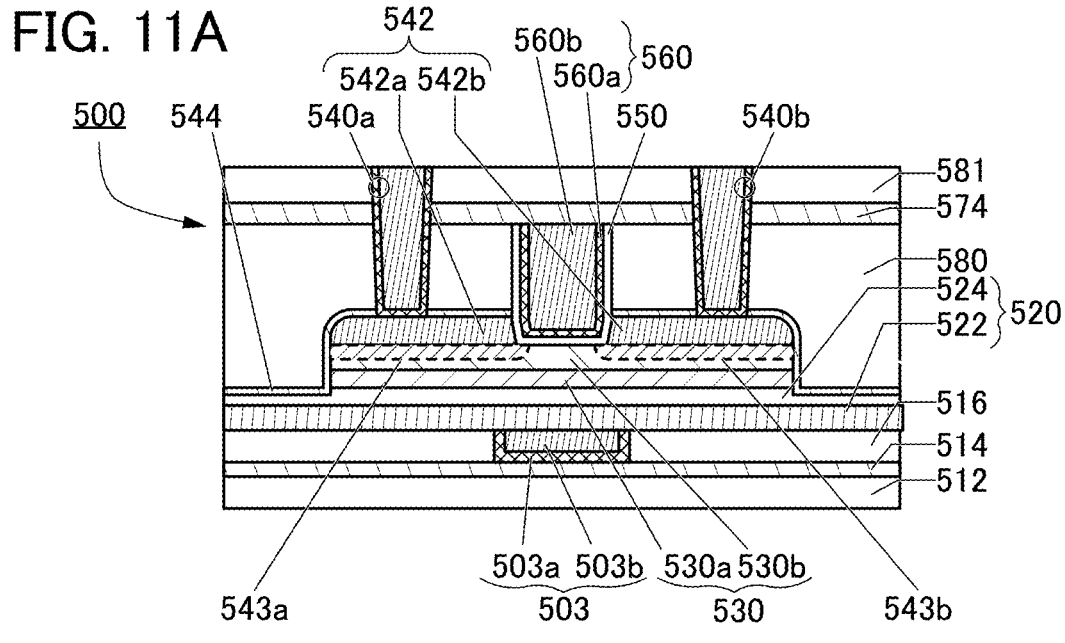
FIG. 11A and FIG. 11B are schematic cross-sectional views each illustrating a structure example of a transistor of a semiconductor device.
Figure 11B:
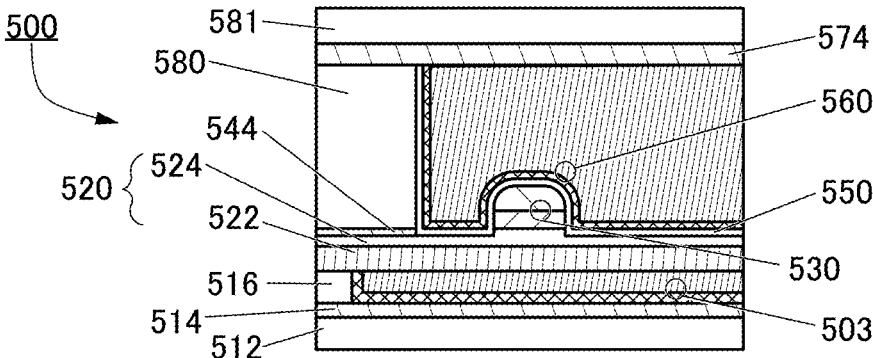

FIG. 11A is a cross-sectional view of a transistor 500 in the channel direction and FIG. 11B is a cross-sectional view of the transistor 500 in the channel width direction. The transistor 500 illustrated in FIG. 11A and FIG. 11B has a structure similar to that of the transistor 100 described in Embodiment 1. Although the transistor 500 has a structure in which a layer 522 of a material that can have ferroelectricity and a conductor 503 are provided, a transistor having a structure in which the layer 522 of the material that can have ferroelectricity or the conductor 503, or neither the layer 522 of the material that can have ferroelectricity nor the conductor 503 is provided can be formed concurrently. In that case, when the layer 522 of the material that can have ferroelectricity is provided in the transistor, the layer 522 of the material that can have ferroelectricity may be extended to share the layer between the transistor and the transistor 500, or the layer 522 of the material that can have ferroelectricity may be provided separately.

The transistor 500 is provided above an insulator 512.

As illustrated in FIG. 11A, the transistor 500 includes an insulator 514 and an insulator 516 placed over the insulator 512, the conductor 503 placed to be embedded in the insulator 514 and the insulator 516, a ferroelectric layer 520 placed over the insulator 516 and the conductor 503, an oxide 530 placed over the ferroelectric layer 520, a conductor 542a and a conductor 542b placed apart from each other over the oxide 530, an insulator 580 that is placed over the conductor 542a and the conductor 542b and is provided with an opening formed to overlap with a region between the conductor 542a and the conductor 542b, an insulator 550 placed on a bottom surface and a side surface of the opening, and a conductor 560 placed on a formation surface of the insulator 550.

The conductor 503 is placed to be embedded in the insulator 514 and the insulator 516 and can be formed by what is called a damascene process. With such a structure, the ferroelectric layer 520 can be provided on a relatively flat surface. When the ferroelectric layer 520 is formed on a relatively flat surface, stress applied to the material that can have ferroelectricity can be constant, so that the ferroelectric layer 520 can constantly have the crystal structure of the material that can have ferroelectricity as a crystal structure in which ferroelectricity is exhibited.

Note that the transistor 500 is illustrated to have a structure in which two layers, the oxide 530a and the oxide 530b, are stacked in the region where the channel is formed and its vicinity; however, one embodiment of the present invention is not limited thereto. For example, a single-layer structure of the oxide 530b, a three-layer structure provided with the oxide 530c over an upper layer of the oxide 530b, or a stacked-layer structure of four or more layers may be employed. Furthermore, although the conductor 560 is illustrated to have a stacked-layer structure of two layers in the transistor 500, one embodiment of the present invention is not limited thereto. For example, the conductor 560 may have a single-layer structure or a stacked-layer structure of three or more layers. Note that the transistor 500 illustrated in FIG. 11A and FIG. 11B is an example, and the structure is not limited thereto; an appropriate transistor can be used in accordance with a circuit configuration or a driving method. Note that in this specification, the oxide 530a and the oxide 530b are sometimes collectively referred to as the oxide 530.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region interposed between the conductor 542a and the conductor 542b. The positions of the conductor 560, the conductor 542a, and the conductor 542b are selected in a self-aligned manner with respect to the opening in the insulator 580. That is, in the transistor 500, the gate electrode can be placed between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not include a region overlapping with the conductor 542a or the conductor 542b. Thus, parasitic capacitance formed between the conductor 560 and each of the conductor 542a and the conductor 542b can be reduced. As a result, the switching speed of the transistor 500 can be increased, and the transistor 500 can have high frequency characteristics.

When the layer 522 of the material that can have ferroelectricity is not provided, the conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 not in synchronization with but independently of a potential applied to the conductor 560. In particular, the threshold voltage of the transistor 500 can be higher than 0 V and the off-state current can be reduced by applying a negative potential to the conductor 503. Thus, drain current at the time when a potential applied to the conductor 560 is 0 V can be lower in the case where a negative potential is applied to the conductor 503 than in the case where the negative potential is not applied to the conductor 503.

The conductor 503 is placed to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

When the layer 522 of the material that can have ferroelectricity is provided, the conductor 503 functions as an electrode for causing remanent polarization by applying an electric field to the layer 522 of the material that can have ferroelectricity. In that case, the conductor 503 and the conductor 560 can independently adjust potentials, and a constant potential is applied during driving of the circuit.

In the conductor 503, a conductor 503a is formed in contact with an inner wall of the opening in the insulator 514 and the insulator 516, and a conductor 503b is formed on the inner side. Although the transistor 500 having a structure in which the conductor 503a and the conductor 503b are stacked is illustrated, one embodiment of the present invention is not limited thereto. For example, the conductor 503 may be provided to have a single-layer structure or a stacked-layer structure of three or more layers.

Here, for the conductor 503a, a conductive material having a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification, a function of inhibiting diffusion of impurities or oxygen means a function of inhibiting diffusion of any one or all of the above impurities and the above oxygen. Specifically, a metal nitride film such as $TiN_X$ or $TaN_X$ is preferably used.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that the conductor 503b is illustrated as a single layer but may have a stacked-layer structure, for example, a stack of the above conductive material and titanium or titanium nitride.

The layer 522 of the material that can have ferroelectricity can be formed using the material described in Embodiment 1. The material that can have ferroelectricity is used under a condition where ferroelectricity is exhibited. The condition where ferroelectricity is exhibited varies depending on a material to be used, specifically, depending on a crystal structure of a crystal included in the film, or the like. For example, when $HfZrO_X$ is used as the material that can have ferroelectricity, the thickness range of the layer of the material that can have ferroelectricity is greater than or equal to 2 nm and less than or equal to 30 nm, preferably greater than or equal to 5 nm and less than or equal to 15 nm. When the crystal structure of the crystal included in the film has an O-phase, ferroelectricity is exhibited.

The ferroelectric layer 520 may be a stack of the layer 522 of the material that can have ferroelectricity and an insulator. FIG. 11 illustrates an example in which the layer 522 of the material that can have ferroelectricity is provided over the insulator 516 and the conductor 503, and an insulator 524 that is a first insulator is provided over the layer 522 of the material that can have ferroelectricity. A second insulator may be provided over the insulator 516 and the conductor 503, and the layer 522 of the material that can have ferroelectricity may be provided over the second insulator. The insulator 524 may be provided on the side closer to the oxide 530, the second insulator may be provided on the side closer to the conductor 503, and the second insulator, the layer 522 of the material that can have ferroelectricity, and the first insulator (the insulator 524) may be sequentially provided over the insulator 516 and the conductor 503.

When the layer 522 of the material that can have ferroelectricity is not provided but the conductor 503 is provided, the first insulator (the insulator 524) or the second insulator, or the first insulator (the insulator 524) and the second insulator have a function as a second gate insulating film. Note that the second insulator can be formed using a material that can be used for the first insulator (the insulator 524).

Here, as the insulator 524 that is in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm³, preferably greater than or equal to $1.0 \times 10^{19}$ atoms/cm³, further preferably greater than or equal to $2.0 \times 10^{19}$ atoms/cm³ or greater than or equal to $3.0 \times 10^{20}$ atoms/cm³ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be $H_2O$, and removed from the oxide 530 or an insulator near the oxide 530 in some cases. Part of hydrogen is diffused into or gettered (also referred to as gettering) by the conductor 542a and the conductor 542b in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2 + Ar)$) is lower than or equal to 50%, preferably higher than or equal to 10% and lower than or equal to 30%.

In a fabrication process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in a nitrogen gas or inert gas atmosphere, another heat treatment may be performed in an atmosphere containing an oxidizing gas at 10 ppm or more, 1% or more, or 10% or more in order to compensate for released oxygen. Alternatively, after heat treatment is performed in an atmosphere containing an oxidizing gas at 10 ppm or more, 1% or more, or 10% or more, another heat treatment may be successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

It is preferable that the second insulator be thermally stable. For example, silicon oxide and silicon oxynitride, which have thermal stability, are suitable. Furthermore, when an insulator that is a high-k material is combined with silicon oxide or silicon oxynitride, the second insulator having a stacked-layer structure that has thermal stability and a high relative permittivity can be obtained.

Note that in the transistor 500 in FIG. 11A and FIG. 11B, the layer 522 of the material that can have ferroelectricity and the insulator 524 are illustrated as the ferroelectric layer 520 having a stacked-layer structure of two layers; however, the ferroelectric layer 520 may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. The metal oxide functioning as an oxide semiconductor is described in detail in Embodiment 4.

The metal oxide functioning as the channel formation region in the oxide 530 has a band gap of preferably 2 eV or more, further preferably 2.5 eV or more. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a structure of a plurality of oxide layers that differ in the atomic ratio of metal atoms. Specifically, the atomic proportion of the element Ma in the constituent elements in the metal oxide used as the oxide 530a is preferably higher than the atomic proportion of the element Ma in the constituent elements in the metal oxide used as the oxide 530b. In addition, the atomic ratio of the element Ma to In in the metal oxide used as the oxide 530a is preferably higher than the atomic ratio of the element Ma to In in the metal oxide used as the oxide 530b. Furthermore, the atomic ratio of In to the element Ma in the metal oxide used as the oxide 530b is preferably higher than the atomic ratio of In to the element Ma in the metal oxide used as the oxide 530a. As the oxide 530c, it is possible to use a metal oxide that can be used as the oxide 530a or the oxide 530b.

Specifically, as the oxide 530a, a metal oxide in which an atomic ratio of In to Ga and Zn is In:Ga:Zn=1:3:4 or 1:1:0.5 is favorably used. In addition, as the oxide 530b, a metal oxide in which an atomic ratio of In to Ga and Zn is In:Ga:Zn=4:2:3 or 1:1:1 is favorably used. In addition, as the oxide 530c, a metal oxide in which an atomic ratio of In to Ga and Zn is In:Ga:Zn=1:3:4 or an atomic ratio of Ga to Zn is Ga:Zn=2:1 or Ga:Zn=2:5 is favorably used. Specific examples of the case where the oxide 530c has a stacked-layer structure include a stacked-layer structure of a layer in which an atomic ratio of In to Ga and Zn is In:Ga:Zn=4:2:3 and a layer with In:Ga:Zn=1:3:4; a stacked-layer structure of a layer in which an atomic ratio of Ga to Zn is Ga:Zn=2:1 and a layer in which an atomic ratio of In to Ga and Zn is In:Ga:Zn=4:2:3; a stacked-layer structure of a layer in which an atomic ratio of Ga to Zn is Ga:Zn=2:5 and a layer in which an atomic ratio of In to Ga and Zn is In:Ga:Zn=4:2:3; and a stacked-layer structure of gallium oxide and a layer in which an atomic ratio of In to Ga and Zn is In:Ga:Zn=4:2:3.

For example, in the case where the atomic ratio of In to the element Ma in the metal oxide used as the oxide 530a is lower than the atomic ratio of In to the element Ma in the metal oxide used as the oxide 530b, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530b.

As the oxide 530b, it is also possible to use a metal oxide having a composition of In:Zn=2:1, a composition of In:Zn=5:1, a composition of In:Zn=10:1, or a composition in the neighborhood of any one of these compositions, other than the above-described compositions.

The oxide 530a, the oxide 530b, and the oxide 530c are preferably combined to satisfy the above relation of the atomic ratios. For example, it is preferable that the oxide 530a and the oxide 530c each be a metal oxide having a composition of In:Ga:Zn=1:3:4 or a composition in the neighborhood thereof and the oxide 530b be a metal oxide having a composition of In:Ga:Zn=4:2:3 to 4:2:4.1 or a composition in the neighborhood thereof, or a metal oxide having a composition of In:Ga:Zn=1:1:2 or a composition in the neighborhood thereof or a composition of In:Ga:Zn=1:1:2 or a composition in the neighborhood thereof. Note that the above composition represents the atomic ratio of an oxide formed over a base or the atomic ratio of a sputtering target. Moreover, it is suitable that the proportion of In is increased in the composition of the oxide 530b because the transistor can have a higher on-state current, higher field effect mobility, or the like.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c are favorably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and thus the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 11A and FIG. 11B, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In the case where the conductor 542a and the conductor 542b are not oxides and a metal oxide is used for the oxide 530, contact between the oxide 530 and each of the conductor 542a and the conductor 542b may diffuse oxygen in the oxide 530 into the conductor 542a and the conductor 542b, resulting in oxidation of the conductor 542a and the conductor 542b. It is highly possible that oxidation of the conductor 542a and the conductor 542b lowers the conductivity of the conductor 542a and the conductor 542b. Note that diffusion of oxygen from the oxide 530 into the conductor 542a and the conductor 542b can be rephrased as absorption of oxygen in the oxide 530 by the conductor 542a and the conductor 542b.

As illustrated in FIG. 11A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide serving as an insulator containing one or more selected from hafnium, aluminum, gallium, yttrium, zirconium, tungsten, titanium, tantalum, nickel, germanium, neodymium, lanthanum, magnesium, and the like can be used as the insulator 544. Moreover, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

With the insulator 544, diffusion of impurities such as water and hydrogen contained in the insulator 580 into the oxide 530b through the oxide 530c and the insulator 550 can be inhibited. Furthermore, oxidation of the conductor 542 due to excess oxygen contained in the insulator 580 can be inhibited.

The insulator 550 functions as a first gate insulating film. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride are preferable because they are thermally stable.

When the insulator from which oxygen is released by heating is used as the insulator 550, oxygen can be effectively supplied from the insulator 550 to the channel formation region of the oxide 530b. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 can be used.

Note that the insulator 550 may have a stacked-layer structure. As miniaturization and high integration of transistors progress, a problem such as leakage current may arise because of a thinner gate insulating film; for that reason, when the insulator functioning as a gate insulating film has a stacked-layer structure of a high-k material and a thermally stable material, a gate potential at the time when the transistor operates can be lowered while the physical thickness of the gate insulating film is maintained. Furthermore, the stacked-layer structure can be thermally stable and have a high relative permittivity.

Although the conductor 560 functioning as a gate electrode or the first gate electrode has a two-layer structure in FIG. 11A and FIG. 111B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting oxygen diffusion, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electrical resistance value to be a conductor. This can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus is preferably a conductor having high conductivity. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 from which oxygen is released by heating is provided, oxygen in the insulator 580 can be efficiently supplied to the oxide 530. The concentration of impurities such as water or hydrogen in the insulator 580 is preferably lowered.

The opening of the insulator 580 is formed to overlap with the region between the conductor 542a and the conductor 542b. Accordingly, the conductor 560 is formed to be embedded in the opening in the insulator 580 and the region interposed between the conductor 542a and the conductor 542b.

The gate length needs to be short for miniaturization of the semiconductor device, but it is necessary to prevent a reduction in conductivity of the conductor 560. When the conductor 560 is made thick for that, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

An insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Thus, oxygen can be supplied from the excess-oxygen regions to the oxide 530.

For example, a metal oxide serving as an insulator containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

Furthermore, a conductor 540a and a conductor 540b are placed in openings formed in the insulator 581, the insulator 574, the insulator 580, and the insulator 544. The conductor 540a and the conductor 540b are provided to face each other with the conductor 560 therebetween.

According to one embodiment of the present invention, a novel transistor can be provided. According to another embodiment of the present invention, a transistor having high reliability and a large S value can be provided. According to another embodiment of the present invention, a transistor whose S value can be changed after the formation of a semiconductor device can be provided.

According to one embodiment of the present invention, a transistor can be formed differently according to presence or absence of a conductive layer and/or a ferroelectric layer which are/is on the back channel side of the transistor, whereby a semiconductor device that includes a transistor whose S value can be changed after the formation of the semiconductor device and a transistor having excellent characteristics in one circuit can be provided.

Note that this embodiment can be combined with any of the other embodiments described in this specification as appropriate.

Embodiment 4

Described in this embodiment is a metal oxide (hereinafter also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of oxide semiconductor is described with reference to FIG. 12A. FIG. 12A is a diagram showing the classification of crystal structures of an oxide semiconductor, typically IGZO (a metal oxide containing In, Ga, and Zn).

As shown in FIG. 12A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 12A are in an intermediate state between "Amorphous" and "Crystal", and belong to a new boundary region (new crystalline phase). That is, these structures are completely different from "Amorphous", which is energetically unstable, and "Crystal".

Note that a crystal structure of a film or a substrate can be evaluated with an X-ray diffraction (XRD) spectrum. FIG. 12B shows an XRD spectrum, which is obtained by GIXD (Grazing-Incidence XRD) measurement, of a CAAC-IGZO film classified into "Crystalline" (the vertical axis represents intensity in arbitrary unit (a. u.)). Note that a GIXD method is also referred to as a thin film method or a Seemann-Bohlin method. The XRD spectrum that is shown in FIG. 12B and obtained by GIXD measurement is hereinafter simply referred to as an XRD spectrum. The CAAC-IGZO film in FIG. 12B has a composition in the vicinity of In:Ga:Zn=4:2:3 [atomic ratio]. The CAAC-IGZO film in FIG. 12B has a thickness of 500 nm.

As shown in FIG. 12B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 12B, the peak at 2θ of around 310 is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 12C shows a diffraction pattern of the CAAC-IGZO film. FIG. 12C shows a diffraction pattern obtained by the NBED method in which an electron beam is incident in the direction parallel to the substrate. The composition of the CAAC-IGZO film in FIG. 12C is In:Ga:Zn=4:2:3 [atomic ratio] or the vicinity thereof. In the nanobeam electron diffraction method, electron diffraction is performed with a probe diameter of 1 nm.

As shown in FIG. 12C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 12A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element Ma is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element Ma, zinc (Zn), and oxygen (hereinafter, an (M,Zn) layer) are stacked. Indium and the element Ma can be replaced with each other. Therefore, indium may be contained in the (M,Zn) layer. In addition, the element Ma may be contained in the In layer. Note that Zn may be contained in the In layer. Such a layered structure is observed as a lattice image in a high-resolution TEM image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] than [In] in the second region and lower [Ga] than [Ga] in the second region. Moreover, the second region has higher [Ga] than [Ga] in the first region and lower [In] than [In] in the first region.

Specifically, the first region contains indium oxide, indium zinc oxide, or the like as its main component. The second region contains gallium oxide, gallium zinc oxide, or the like as its main component. That is, the first region can be rephrased with a region containing In as its main component. The second region can be rephrased with a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

Note that the CAC-OS is regarded as not including a stacked-layer structure of two or more kinds of films with different compositions. A part that is taken out from a layered crystal structure is not regarded as each of the first region and the second region. That is, in the case where the first region and the second region include crystals, these crystals are different from each other.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (p), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon and/or carbon, which is one of Group 14 elements, is contained in the oxide semiconductor, defect states are formed in the oxide semiconductor. Thus, the concentration of silicon and/or carbon in the oxide semiconductor and the concentration of silicon and/or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In particular, hydrogen contained in an oxide semiconductor reacts with oxygen bonded to a metal atom to be water, and thus forms oxygen vacancies in the oxide semiconductor in some cases. In the case where hydrogen enters an oxygen vacancy in the oxide 530, the oxygen vacancy and the hydrogen are bonded to each other to form VoH in some cases. The VoH serves as a donor and an electron that is a carrier is generated in some cases. In other cases, bonding of part of hydrogen to oxygen bonded to a metal atom generates an electron serving as a carrier. Thus, a transistor using an oxide semiconductor that contains a large amount of hydrogen is likely to have normally-on characteristics. Moreover, hydrogen in an oxide semiconductor is easily transferred by a stress such as heat or an electric field; thus, a large amount of hydrogen contained in an oxide semiconductor might reduce the reliability of the transistor.

In one embodiment of the present invention, VoH in the oxide 530 is preferably reduced as much as possible so that the oxide 530 becomes a highly purified intrinsic or substantially highly purified intrinsic oxide. In order to obtain such an oxide semiconductor with sufficiently reduced VoH, it is important to remove impurities such as moisture and hydrogen in the oxide semiconductor (this treatment is sometimes referred to as dehydration or dehydrogenation treatment) and supply oxygen to the oxide semiconductor to fill oxygen vacancies (this treatment is sometimes referred to as oxygen adding treatment). When an oxide semiconductor with sufficiently reduced impurities such as VoH is used for a channel formation region of a transistor, stable electrical characteristics can be given.

A defect in which hydrogen has entered an oxygen vacancy can function as a donor of the oxide semiconductor. However, it is difficult to evaluate the defect quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" described in this specification and the like can be replaced with "donor concentration" in some cases.

Therefore, when an oxide semiconductor is used for the oxide 530, hydrogen in the oxide semiconductor is preferably reduced as much as possible. Specifically, the hydrogen concentration in the oxide semiconductor that is obtained by secondary ion mass spectrometry (SIMS) is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

In the case where a oxide semiconductor is used for the oxide 530, the oxide semiconductor is an intrinsic (also referred to as I-type) or substantially intrinsic semiconductor that has a large band gap, and the carrier concentration of the oxide semiconductor in the channel formation region is preferably lower than $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier concentration of the oxide semiconductor in the channel formation region is not particularly limited and can be, for example, $1\times10^{-9}$ cm$^{-3}$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 5

The semiconductor device of one embodiment of the present invention can be used for processors such as CPUs or GPUs, or chips. When the semiconductor device described in the above embodiment is used for processors such as CPUs or GPUs, or chips, their sizes and their power consumption can be reduced. FIG. 13A to FIG. 13H illustrate specific examples of electronic devices each including a processor such as a CPU or a GPU or a chip of one embodiment of the present invention.

<Electronic Devices and Systems>

The chip such as the CPU or the GPU of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 13A to FIG. 13H illustrate examples of electronic devices.

[Information Terminal]

Figures 13A, 13B, 13C, 13D, 13E, 13F, 13G, 13H:
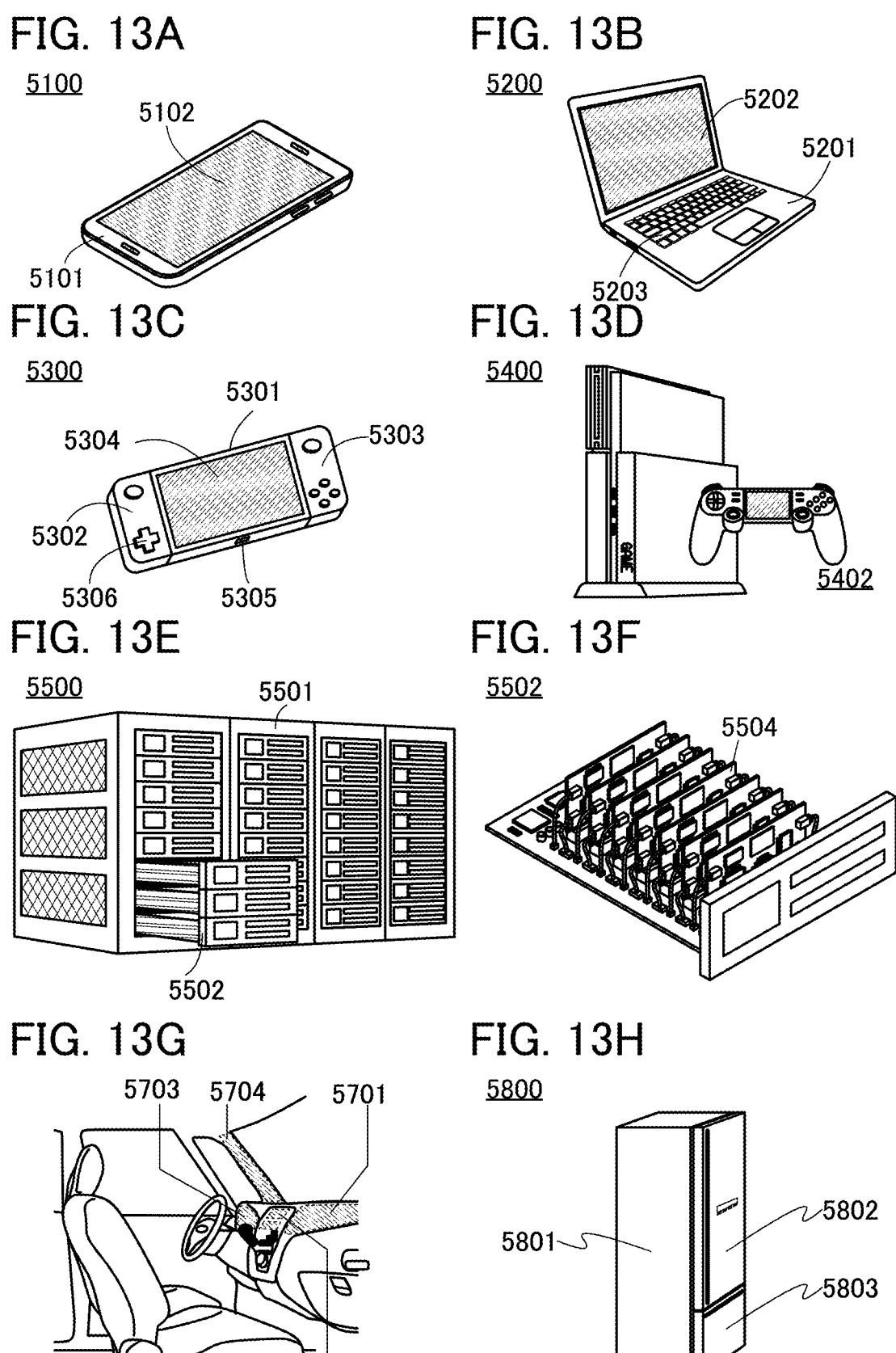
FIG. 13A to FIG. 13H illustrate electronic devices.

FIG. 13A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the contents of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

FIG. 13B illustrates a notebook information terminal 5200. The notebook information terminal 5200 includes a main body 5201 of the information terminal, a display portion 5202, and a keyboard 5203.

When the chip of one embodiment of the present invention is applied to the notebook information terminal 5200, the notebook information terminal 5200 can execute an application utilizing artificial intelligence like the information terminal 5100 described above. Examples of the application utilizing artificial intelligence include design-support software, text correction software, and software for automatic menu generation. Furthermore, with the use of the notebook information terminal 5200, novel artificial intelligence can be developed.

Note that although FIG. 13A and FIG. 13B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

FIG. 13C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

FIG. 13D illustrates a stationary game machine 5400 as an example of a game machine. A controller 5402 is wired or connected wirelessly to the stationary game machine 5400.

Using the chip such as the CPU or the GPU of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit itself, a peripheral circuit, and a module can be reduced.

Furthermore, when the chip such as the CPU or the GPU of one embodiment of the present invention is used in the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are illustrated as examples of game machines in FIG. 13C and FIG. 13D, the game machine using the chip such as the CPU or the GPU of one embodiment of the present invention is not limited thereto. Examples of the game machine to which the chip such as the CPU or the GPU of one embodiment of the present invention is used include an arcade game machine installed in entertainment facilities (a game center, an amusement park, and the like), and a throwing machine for batting practice installed in sports facilities.

[Large Computer]

The chip such as the CPU or the GPU of one embodiment of the present invention can be used in a large computer.

FIG. 13E illustrates a supercomputer 5500 as an example of a large computer. FIG. 13F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the chip such as the CPU or the GPU of one embodiment of the present invention in the supercomputer 5500 achieves a low-power-consumption supercomputer. Moreover, heat generation from a circuit can be reduced owing to low power consumption; thus, the influence of heat generation on the circuit itself, a peripheral circuit, and a module can be reduced.

Although a supercomputer is illustrated as an example of a large computer in FIG. 13E and FIG. 13F, a large computer using the chip such as the CPU or the GPU of one embodiment of the present invention is not limited thereto. Other examples of large computers in which the chip such as the CPU or the GPU of one embodiment of the present invention is usable include a computer that provides service (a server) and a large general-purpose computer (a mainframe).

[Moving Vehicle]

The chip such as the CPU or the GPU of one embodiment of the present invention can be used in an automobile, which is a moving vehicle, and the periphery of a driver's seat in the automobile.

FIG. 13G illustrates an area around a windshield inside an automobile, which is an example of a moving vehicle. FIG. 13G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile. That is, displaying an image taken by the imaging device provided outside the automobile leads to compensation for the blind spot and an increase in safety. Display of an image that complements the area that cannot be seen makes it possible to confirm safety more naturally and comfortably. The display panel 5704 can also be used as a lighting device.

Since the chip such as the CPU or the GPU of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is used for each of these moving vehicles.

[Household Appliance]

FIG. 13H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

At least part of the structure, method, and the like described in this embodiment can be implemented in appropriate combination with any of those in the other embodiments and the other examples described in this specification.

Example 1

In this example, contents of simulation performed on the transistor 100 illustrated in FIG. 1 and the results are described.

Figure 14A:
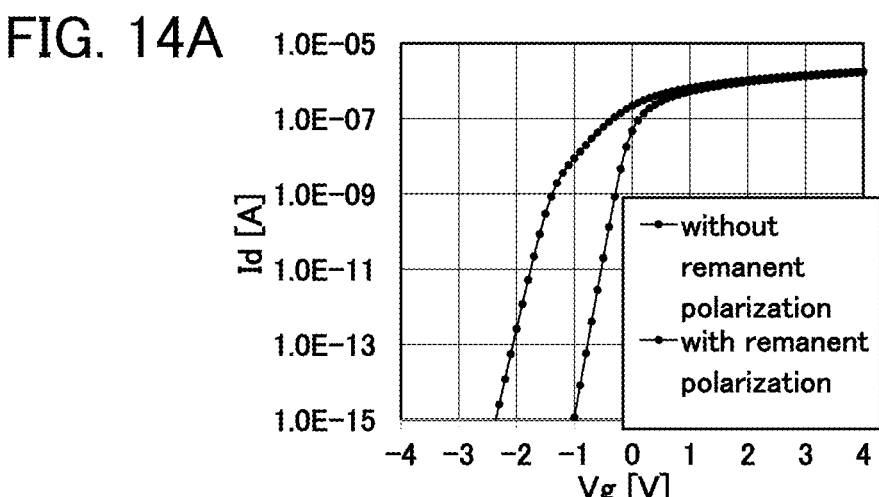
FIG. 14A is a diagram showing Id-Vg curves by device simulation.
Figure 14B:
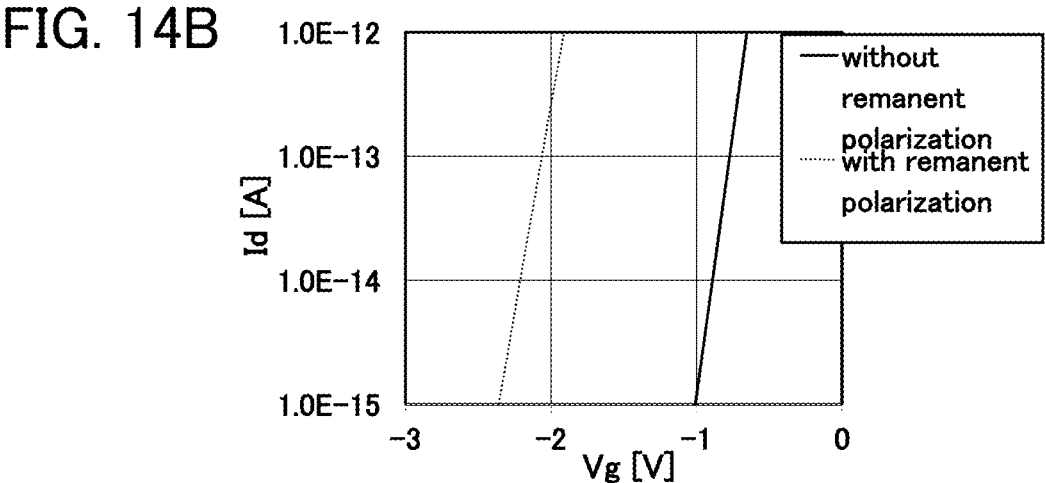
FIG. 14B is an enlarged view of part of FIG. 14A.
Figure 14C:
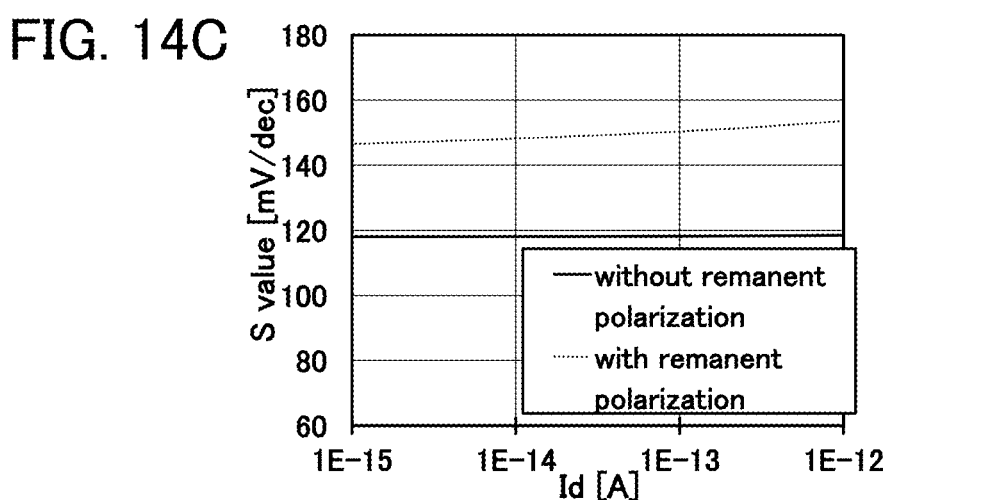
FIG. 14C is a diagram showing an S value calculated at each Id, with Id in FIG. 14B represented by the horizontal axis.

In the simulation, depending on whether remanent polarization (spontaneous polarization) occurs or not in the ferroelectric layer on the back channel side of the transistor 100, how the transistor characteristic (S value) changes is observed. Specifically, in the transistor in FIG. 1, fixed charge corresponding to the remanent polarization is formed in the ferroelectric layer, and device simulation is performed. Note that parameters such as the thickness of each layer and the relative permittivity are omitted. FIG. 14A to FIG. 14C show the device simulation results. FIG. 14A shows Id-Vg curves, FIG. 14B is an enlarged view of a region where Id is from $1\times10^{-15}$ A to $1\times10^{-12}$ A, and FIG. 14C is a diagram showing the S value calculated at each Id, with Id in the above range represented by the horizontal axis.

The results in FIG. 14B show that forming fixed charge (corresponding to "with remanent polarization") shifts rising of Id in a subthreshold region to the negative side as compared to the case where an fixed electric field is not forming (corresponding to "without remanent polarization"). It can be confirmed from FIG. 14C that the S value is increased.

REFERENCE NUMERALS

100: transistor, 103: conductive layer, 120: ferroelectric layer, 122: layer of material that can have ferroelectricity, 124: insulating layer, 130: semiconductor layer, 142a: conductive layer, 142b: conductive layer, 160: gate electrode, 500: transistor, 503: conductor, 503a: conductor, 503b: conductor, 512: insulator, 514: insulator, 516: insulator, 520: ferroelectric layer, 522: layer of material that can have ferroelectricity, 524: insulator, 530: oxide, 530a: oxide, 530b: oxide, 530c: oxide,

540a: conductor, 540b: conductor, 542: conductor, 542a: conductor, 542b: conductor, 543a: region, 543b: region, 544: insulator, 550: insulator, 560: conductor, 560a: conductor, 560b: conductor, 574: insulator, 580: insulator, 581: insulator

The invention claimed is:

1. A semiconductor device comprising:
a first transistor;
a second transistor;
a third transistor;
a fourth transistor;
a first capacitor; and
a second capacitor,
wherein a gate of the first transistor and a gate of the second transistor are electrically connected to a first wiring,
wherein one of a source and a drain of the first transistor and one of a source and a drain of the third transistor are electrically connected to a second wiring,
wherein the other of the source and the drain of the first transistor is electrically connected to a gate of the third transistor,
wherein one of a source and a drain of the second transistor and one of a source and a drain of the fourth transistor are electrically connected to a third wiring,
wherein the other of the source and the drain of the second transistor is electrically connected to a gate of the fourth transistor,
wherein the gate of the third transistor is connected to the second wiring through the first capacitor,
wherein the gate of the fourth transistor is connected to the second wiring through the second capacitor,
wherein the third transistor and the fourth transistor each comprise:
a first oxide semiconductor layer comprising a channel formation region;
a first gate electrode comprising a region overlapping with the first oxide semiconductor layer with a first insulating layer therebetween; and
a first conductive layer comprising a region overlapping with the first oxide semiconductor layer with a ferroelectric layer therebetween,
wherein the first transistor and the second transistor each comprise a second oxide semiconductor layer comprising a channel formation region,
wherein the ferroelectric layer comprises a crystal, and
wherein the crystal has a crystal structure exhibiting ferroelectricity.

2. The semiconductor device according to claim 1,
wherein the ferroelectric layer comprises an oxide containing at least one of hafnium and zirconium.

3. The semiconductor device according to claim 1,
wherein polarization occurs in the ferroelectric layer by applying an electric field between the first conductive layer and the first oxide semiconductor layer.

4. A semiconductor device comprising:
a first transistor;
a second transistor;
a third transistor;
a fourth transistor;
a first capacitor; and
a second capacitor,
wherein a gate of the first transistor and a gate of the second transistor are electrically connected to a first wiring, wherein one of a source and a drain of the first transistor and one of a source and a drain of the third transistor are electrically connected to a second wiring, wherein the other of the source and the drain of the first transistor is electrically connected to a gate of the third transistor, wherein one of a source and a drain of the second transistor and one of a source and a drain of the fourth transistor are electrically connected to a third wiring, wherein the other of the source and the drain of the second transistor is electrically connected to a gate of the fourth transistor, wherein the gate of the third transistor is connected to the second wiring through the first capacitor, wherein the gate of the fourth transistor is connected to the second wiring through the second capacitor, and wherein an S value of the third transistor and an S value of the fourth transistor are larger than an S value of the first transistor.

5. The semiconductor device according to claim 4, wherein the third transistor and the fourth transistor each comprise:

a first conductive layer;

a ferroelectric layer over the first conductive layer;

a first oxide semiconductor layer comprising a region overlapping with the first conductive layer with the ferroelectric layer provided therebetween;

a first insulating layer over the first oxide semiconductor layer; and a first gate electrode comprising a region overlapping with the first oxide semiconductor layer with the first insulating layer provided therebetween.

6. The semiconductor device according to claim 5, wherein the ferroelectric layer comprises an oxide containing at least one of hafnium and zirconium.

7. A semiconductor device comprising:

a first transistor;

a second transistor;

a third transistor;

a fourth transistor;

a first capacitor; and a second capacitor, wherein a gate of the first transistor and a gate of the second transistor are electrically connected to a first wiring, wherein one of a source and a drain of the first transistor and one of a source and a drain of the third transistor are electrically connected to a second wiring, wherein the other of the source and the drain of the first transistor is electrically connected to a gate of the third transistor, wherein one of a source and a drain of the second transistor and one of a source and a drain of the fourth transistor are electrically connected to a third wiring, wherein the other of the source and the drain of the second transistor is electrically connected to a gate of the fourth transistor, wherein the gate of the third transistor is connected to a first electrode of the first capacitor, wherein the gate of the fourth transistor is connected to a first electrode of the second capacitor, wherein the second wiring is connected to a second electrode of the first capacitor and a second electrode of the second capacitor, wherein the third transistor and the fourth transistor each comprise:

a first oxide semiconductor layer comprising a channel formation region;

a first gate electrode comprising a region overlapping with the first oxide semiconductor layer with a first insulating layer provided therebetween; and a first conductive layer comprising a region overlapping with the first oxide semiconductor layer with a ferroelectric layer provided therebetween, and wherein the first transistor and the second transistor each comprise a second oxide semiconductor comprising a channel formation region.

8. The semiconductor device according to claim 7, wherein the ferroelectric layer comprises an oxide containing at least one of hafnium and zirconium.

9. The semiconductor device according to claim 7, wherein polarization occurs in the ferroelectric layer by applying an electric field between the first conductive layer and the first oxide semiconductor layer.

* * * * *